US012142455B2

(12) United States Patent
Liu et al.

(10) Patent No.: US 12,142,455 B2
(45) Date of Patent: Nov. 12, 2024

(54) CHARGED PARTICLE BEAM APPARATUS WITH MULTIPLE DETECTORS AND METHODS FOR IMAGING

(71) Applicant: ASML Netherlands B.V., Veldhoven (NL)

(72) Inventors: Xuedong Liu, San Jose, CA (US); Weimin Zhou, San Jose, CA (US); Xiaoxue Chen, Fremont, CA (US); Xiaoyu Ji, Beijing (CN); Heng Li, San Jose, CA (US); Shahedul Hoque, Milpitas, CA (US); Zongyao Li, San Jose, CA (US); Shuhao Liu, San Jose, CA (US); Weiming Ren, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 244 days.

(21) Appl. No.: 17/226,017

(22) Filed: Apr. 8, 2021

(65) Prior Publication Data

US 2021/0319977 A1    Oct. 14, 2021

Related U.S. Application Data

(60) Provisional application No. 63/008,457, filed on Apr. 10, 2020.

(51) Int. Cl.
*H01J 37/28* (2006.01)
*H01J 37/145* (2006.01)
(Continued)

(52) U.S. Cl.
CPC ............ *H01J 37/28* (2013.01); *H01J 37/145* (2013.01); *H01J 37/1474* (2013.01);
(Continued)

(58) Field of Classification Search
CPC .. H01J 37/00; H01J 37/02; H01J 37/26; H01J 37/28; H01J 37/145; H01J 37/1474;
(Continued)

(56) References Cited

U.S. PATENT DOCUMENTS 5,023,457 A    6/1991  Yonezawa
5,872,358 A *  2/1999  Todokoro ............... H01J 37/28
                                                        250/397

(Continued)

FOREIGN PATENT DOCUMENTS

JP    H01-264158 A    10/1989
JP    2000-299078 A   10/2000
(Continued)

OTHER PUBLICATIONS

Office Action of the Intellectual Property Office of Taiwan issued in related Taiwanese Patent Application No. 110112483; mailed Apr. 15, 2022 (15 pgs.).

*Primary Examiner* — Jason L McCormack
(74) *Attorney, Agent, or Firm* — Finnegan, Henderson, Farabow, Garrett & Dunner, LLP

(57) ABSTRACT

Systems and methods of imaging a sample using a charged-particle beam apparatus are disclosed. The charged-particle beam apparatus may include a compound objective lens comprising a magnetic lens and an electrostatic lens, the magnetic lens comprising a cavity, and an electron detector located immediately upstream from a polepiece of the magnetic lens and inside the cavity of the magnetic lens. In some embodiments, deflectors may be located between the electron detector and the opening of the polepiece adjacent to the sample to achieve a large field of view. Electron distributions among the detectors can be manipulated without changing the landing energy by changing the potential of the control electrode(s) in the electrostatic objective lens. The electron source can be operated with several discrete (Continued)

potentials to cover different landing energies, while the potential difference between electron source and the extractor is fixed.

15 Claims, 17 Drawing Sheets

(51) Int. Cl.
    *H01J 37/147*     (2006.01)
    *H01J 37/244*     (2006.01)

(52) U.S. Cl.
    CPC ... *H01J 37/244* (2013.01); *H01J 2237/24475* (2013.01); *H01J 2237/2448* (2013.01)

(58) Field of Classification Search
    CPC ........... H01J 37/244; H01J 2237/24475; H01J 2237/2448; H01J 2237/2817
    USPC ......................................... 250/306, 307, 311
    See application file for complete search history.

(56) References Cited

U.S. PATENT DOCUMENTS

| | | | |
|---|---|---|---|
| 6,043,491 A | 3/2000 | Ose et al. | |
| 7,544,937 B2 | 6/2009 | Frosien | |
| 7,847,267 B2 | 12/2010 | Shemesh et al. | |
| 8,618,480 B2 | 12/2013 | Ren et al. | |
| 2002/0185599 A1* | 12/2002 | Kimura | H01J 37/244 |
| | | | 250/310 |
| 2006/0226360 A1 | 10/2006 | Frosien | |
| 2008/0149831 A1 | 6/2008 | Saito | |
| 2009/0101817 A1 | 4/2009 | Ohshima et al. | |
| 2010/0200748 A1 | 8/2010 | Adamec et al. | |
| 2012/0025074 A1 | 2/2012 | Barbi et al. | |
| 2012/0261573 A1 | 10/2012 | Amadec | |
| 2012/0298864 A1 | 11/2012 | Morishita et al. | |
| 2014/0070098 A1* | 3/2014 | Sytar | H01J 37/28 |
| | | | 250/307 |
| 2014/0284476 A1 | 9/2014 | Ren et al. | |
| 2014/0361168 A1 | 12/2014 | Ogawa et al. | |
| 2016/0064184 A1* | 3/2016 | Brown | H01L 27/14661 |
| | | | 250/307 |
| 2017/0154752 A1* | 6/2017 | Essers | H01J 37/18 |
| 2017/0271124 A1* | 9/2017 | Sasaki | H01J 37/244 |
| 2018/0364563 A1* | 12/2018 | Virdi | G01N 23/203 |
| 2019/0043691 A1* | 2/2019 | Zhang | H01J 37/28 |
| 2019/0088444 A1 | 3/2019 | Attal et al. | |

FOREIGN PATENT DOCUMENTS

| | | |
|---|---|---|
| JP | 2011-119446 A | 6/2011 |
| JP | 2014-053306 A | 3/2014 |
| JP | 2017-526142 A | 9/2017 |
| JP | 2019509586 A | 4/2019 |
| TW | 201942941 A | 11/2019 |
| WO | WO 2001/075929 A1 | 10/2001 |
| WO | WO 2005/017511 A1 | 2/2005 |
| WO | WO 2008/058491 A2 | 5/2008 |
| WO | WO 2016/033388 | 3/2016 |
| WO | WO 2018/173242 A1 | 9/2018 |
| WO | WO 2019/224896 A1 | 11/2019 |

* cited by examiner

CHARGED PARTICLE BEAM APPARATUS WITH MULTIPLE DETECTORS AND METHODS FOR IMAGING

CROSS-REFERENCE TO RELATED APPLICATIONS

This application claims priority of U.S. application Ser. No. 63/008,457 which was filed on Apr. 10, 2020 and which is incorporated herein in its entirety by reference.

TECHNICAL FIELD

The embodiments provided herein disclose a charged-particle beam apparatus, and more particularly systems and methods for enhancing signal electron collection efficiency in an electron microscope.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, and their structures continue to become more complex, accuracy and throughput in defect detection and inspection become more important. The overall image quality depends on a combination of high secondary-electron and backscattered-electron signal detection efficiencies, among other things. Backscattered electrons have higher emission energy to escape from deeper layers of a sample, and therefore, their detection may be desirable for imaging of complex structures such as buried layers, nodes, high-aspect-ratio trenches or holes of 3D NAND devices. For applications such as overlay metrology, it may be desirable to obtain high quality imaging and efficient collection of surface information from secondary electrons and buried layer information from backscattered electrons, simultaneously, highlighting a need for using multiple electron detectors in a SEM. Although multiple electron detectors in various structural arrangements may be used to maximize collection and detection efficiencies of secondary and back-scattered electrons individually, the combined detection efficiencies remain low, and therefore, the image quality achieved may be inadequate for high accuracy and high throughput defect inspection and metrology of two-dimensional and three-dimensional structures.

SUMMARY

One aspect of the present disclosure is directed to an electron beam apparatus comprising an electron source configured to generate a primary electron beam along a primary optical axis, a compound objective lens comprising a magnetic lens and an electrostatic lens, the magnetic lens comprising a cavity configured to allow the primary electron beam to pass through; and a first electron detector configured to detect a first portion of a plurality of signal electrons generated from a sample, wherein the first electron detector is located immediately upstream from a polepiece of the magnetic lens with respect to a path of the primary electron beam along the primary optical axis and inside the cavity of the magnetic lens. The first electron detector may be positioned such that a central axis of an opening of the first electron detector is aligned with the primary optical axis. The opening of the first electron detector may be smaller than the first opening of the polepiece of the objective lens. The apparatus may further comprise a second electron detector configured to detect a second portion of the plurality of signal electrons, and disposed upstream from the first electron detector along the primary optical axis. The opening of the first detector may be configured to allow the second portion of the plurality of signal electrons to pass through. The second electron detector may comprise an opening configured to allow a portion of the primary electron beam to pass through. The second electron detector may comprise an in-lens detector positioned such that the opening of the second electron detector is aligned with the primary optical axis. The apparatus may further comprise a beam manipulator configured to deflect the primary electron beam onto a surface of the sample and located between the first and the second electron detector. The beam manipulator may comprise a plurality of beam deflectors aligned with the primary optical axis and located inside the cavity of the magnetic lens. The apparatus may further comprise a third electron detector configured to detect a third portion of the plurality of signal electrons, and disposed downstream from the first electron detector along the primary optical axis. The third electron detector may be disposed along the primary optical axis downstream from the first electron detector and immediately upstream from the polepiece of the magnetic lens. The third electron detector may be disposed along the primary optical axis between the polepiece of the magnetic lens and the sample. A size of an opening of the third electron detector may be determined based on a desired field-of-view (FOV) and a distribution of the plurality of signal electrons. The first, the second, and the third electron detectors may be configured to detect a substantial portion of the plurality of signal electrons generated from the sample. The first, the second, and the third electron detectors may comprise a continuous detection surface or a segmented detection surface. The segmented detection surface may comprise a plurality of segments arranged radially or azimuthally around the primary optical axis. The apparatus may further comprise a control electrode disposed between the sample and the first electron detector and may be configured to adjust a path of the plurality of signal electrons generated from the sample. The control electrode may comprise a plurality of electrodes disposed between the first electron detector and the sample. The control electrode may be configured to influence an electrostatic field near the sample based on an applied voltage signal. The polepiece of the magnetic lens may be configured to substantially shield the first electron detector from the electrostatic field near the sample. A change in the electrostatic field may cause a change in a trajectory of the first portion of the plurality of signal electrons. The applied voltage signal may be configured to be adjustable to enable influencing the angular distribution of the plurality of signal electrons across a plurality of electron detectors that includes the first electron detector. A position of a plane of the sample may be adjustable along the primary optical axis to enable influencing the angular distribution of the plurality of signal electrons across the plurality of electron detectors, and an excitation of the compound objective lens. The electrostatic lens may be formed in presence of an electric field between the polepiece and the sample. The plurality of signal electrons comprises secondary electrons, backscattered electrons, or auger electrons. A vertical distance between the first electron detector and the sample is in a range of 6 mm to 80 mm.

Another aspect of the present disclosure is directed to an electron beam apparatus comprising an electron source configured to generate a primary electron beam along a primary optical axis; a compound objective lens comprising a magnetic lens and an electrostatic lens, the magnetic lens comprising a cavity configured to allow the primary electron beam to pass through; a first electron detector configured to detect a first portion of a plurality of signal electrons generated from the sample, wherein the first electron detector is located inside the cavity of the magnetic lens; and a beam manipulator configured to deflect the primary electron beam onto a surface of the sample, and located between the first electron detector and the polepiece. The beam manipulator may comprise a plurality of beam deflectors, and wherein a beam deflector of the plurality of beam deflectors is located between the first electron detector and the polepiece of the magnetic lens, and inside the cavity of the magnetic lens.

Another aspect of the present disclosure is directed to an electron beam apparatus comprising first electrode configured to be applied a first voltage; and a second electrode configured to be applied a second voltage different from the first voltage, a first electric field created between the first and the second electrode by a difference in the first and the second voltages, the first electric field configured to extract a plurality of primary electrons from the first electrode, wherein the first voltage is adjusted to a first discrete value and the second voltage is simultaneously adjusted to a second discrete value different from the first discrete value, the first and the second discrete values corresponding to a range of landing energy of the plurality of primary electrons on a sample. A difference between the first and the second discrete values of the first and the second voltage may be substantially-fixed for a plurality of ranges of landing energy. An absolute value of the difference between the first and the second discrete values may be in a range of 5 kV-15 kV. The substantially fixed difference between the first and the second discrete values may create a substantially stable electric field between the electron source and the electrode. A third voltage may be applied to the sample, a value of the third voltage determined based on the first and the second voltages and the range of landing energy of the plurality of primary electrons.

Another aspect of the present disclosure is directed to a method performed by an electron beam apparatus for observing a sample. The method may comprise focusing a primary electron beam onto the sample using a compound objective lens comprising a magnetic lens and an electrostatic lens, the magnetic lens comprising a cavity that allows the primary electron beam to pass through; generating a plurality of signal electrons from the sample after interaction with the primary electron beam; and detecting a first portion of the plurality of signal electrons using a first electron detector located immediately upstream from a polepiece of the magnetic lens with respect to a path of the primary electron beam along a primary optical axis and inside the cavity of the magnetic lens. The method may further comprise detecting, using a second electron detector, a second portion of the plurality of signal electrons and detecting the plurality of signal electrons based on a characteristic of a signal electron of the plurality of signal electrons. The characteristic of the signal electron may comprise an emission energy, an emission polar angle, or an emission azimuth angle of the signal electron with reference to a primary optical axis. The method may further comprise detecting, using a third electron detector, a third portion of the plurality of signal electrons, the third electron detector located downstream of the first and the second electron detectors. The method may further comprise detecting, using the first, the second and the third electron detectors, substantially all signal electrons of the plurality of signal electrons generated from the sample. The method may further comprise influencing, using a control electrode, an electrostatic field near the sample by adjusting a voltage applied to the control electrode and adjusting the voltage applied to the control electrode causes a change in a signal electron detection distribution across the first, the second, and the third electron detectors. Adjusting the voltage applied to the control electrode may cause a change in a trajectory of the first portion of the plurality of signal electrons. Adjusting the voltage applied to the control electrode may influence the angular distribution of the plurality of signal electrons across a plurality of electron detectors that includes the first electron detector. The method may further comprise adjusting a position of a plane of the sample to enable influencing the angular distribution of the plurality of signal electrons across the plurality of electron detectors, and an excitation of the compound objective lens. The position of the plane may be adjusted along the primary optical axis. Adjusting the position of the plane of the sample may comprise increasing or decreasing a vertical distance between the sample and the first electron detector.

Another aspect of the present disclosure is directed to a method of configuring an electron beam apparatus for observing a sample, the method comprising applying a first voltage to a first electrode; applying a second voltage, different from the first voltage, to a second electrode, causing a first electric field to be created between the first and the second electrode based on a difference in the first and the second voltages, the first electric field configured to extract a plurality of primary electrons from the first electrode; and simultaneously adjusting the first voltage to a first discrete value and the second voltage to a second discrete value different from the first discrete value, the first and the second discrete values corresponding to a range of landing energy of the plurality of primary electrons on a sample. A difference between the first and the second discrete values of the first and the second voltage may be substantially fixed for a plurality of ranges of landing energy. An absolute value of the difference between the first and the second discrete values may be in a range of 5 kV-15 kV. The substantially fixed difference between the first and the second discrete values may create a substantially stable electric field between the electron source and the electrode. The method may comprise applying a third voltage to the sample, a value of the third voltage determined based on the first and the second voltages and the range of landing energy of the plurality of primary electrons.

Another aspect of the present disclosure is directed to a non-transitory computer readable medium storing a set of instructions that is executable by one or more processors of an electron beam apparatus to cause the electron beam apparatus to perform a method of observing a sample. The method may comprise focusing a primary electron beam onto the sample using a compound objective lens comprising a magnetic lens and an electrostatic lens, the magnetic lens comprising a cavity that allows the primary electron beam to pass through; generating a plurality of signal electrons from the sample after interaction with a primary electron beam; and detecting a first portion of the plurality of signal electrons using a first electron detector located immediately upstream from a polepiece of the magnetic lens with respect to a path of the primary electron beam along a primary optical axis and inside the cavity of the magnetic lens. The instructions may cause the apparatus to further perform detecting, using a second electron detector, a second portion of the plurality of signal electrons and influencing, using a control electrode, an electrostatic field near the sample by adjusting a voltage applied to the control electrode, wherein adjusting the voltage applied to the control electrode causes a change in a trajectory of the first portion of the plurality of signal electrons. The instructions may cause the apparatus to further perform adjusting a position of a plane of the sample along the primary optical axis, wherein adjusting the position of the plane of the sample causes a change in a signal electron detection distribution across the first and the second electron detectors.

Another aspect of the present disclosure is directed to a non-transitory computer readable medium storing a set of instructions that is executable by one or more processors of an electron beam apparatus to configure the electron beam apparatus to perform a method of observing a sample. The method may comprise applying a first voltage to a first electrode; applying a second voltage, different from the first voltage, to a second electrode, causing a first electric field to be created between the first and the second electrode based on a difference in the first and the second voltages, the first electric field configured to extract a plurality of primary electrons from the first electrode; and simultaneously adjusting the first voltage to a first discrete value and the second voltage to a second discrete value different from the first discrete value, the first and the second discrete values corresponding to a range of landing energy of the plurality of primary electrons on a sample.

Another aspect of the present disclosure is directed to an electron beam apparatus comprising an electron source configured to generate a primary electron beam along a primary optical axis, an objective lens configured to focus the primary electron beam onto a sample and comprising a cavity configured to allow the primary electron beam to pass through; and a first electron detector configured to detect a first portion of a plurality of signal electrons generated from the a sample, wherein the first electron detector is located immediately upstream from a polepiece of the objective lens with respect to a path of the primary electron beam along the primary optical axis and inside the cavity of the objective lens.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
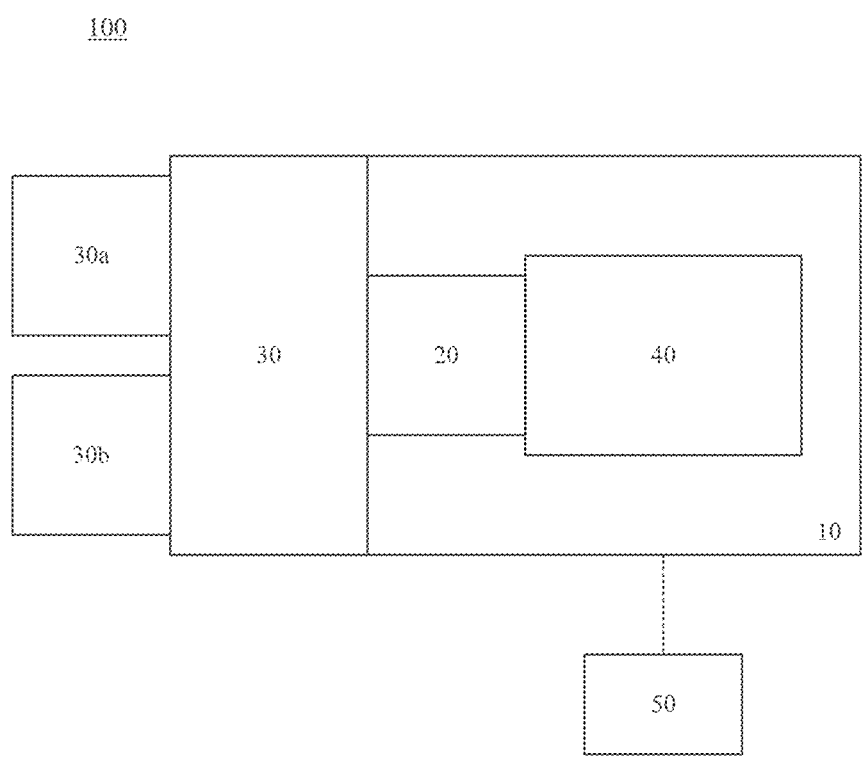
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, thereby rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur. It may be desirable to have higher throughput for defect detection and inspection processes to meet the requirements of IC manufacturers.

The accuracy, reliability, and throughput of inspection of high-density IC chips using SEMs may depend on the image quality of the system, among other things. One of several ways to obtain and maintain high image quality is to maximize the collection efficiency of signal electrons, such as secondary (SE) and backscattered electrons (BSEs). When a primary electron strikes the surface of a sample, it interacts with a volume of the sample based on the landing energy, sample material, spot size, among other things, and generates a plurality of signal electrons. BSEs have higher energies and originate from deeper areas within the interaction volume, and thus provide information associated with composition and distribution of a material. Therefore, maximum detection of backscattered electrons may be desirable to obtain high quality images of underlying defects.

SE and BSE collection efficiency may be enhanced using more than one detectors placed advantageously to collect as many electrons as possible. However, one of several challenges may include efficient detection of BSEs with medium emission angles. This may be desirable because backscattered electrons with emission angles in the range of 15°-65° constitute approximately 75% of the total BSEs generated.

In conventional SEMs, one of several ways to enhance the collection efficiency of BSEs may include adjusting a position of the electron detector to capture BSEs with a wide range of emission angles. Although, the collection efficiency of BSEs having small and large emission angles may be improved, however, the collection efficiency of BSEs with medium emission angle remains low. Alternatively, the size of the opening of a large emission angle BSE detector may be limited to detect a maximum amount of large emission angle BSEs while allowing a substantial portion of medium emission angle BSEs to pass through to be detected by another BSE detector, however, this may increase the aberrations, and therefore, negatively affect the overall imaging resolution. Therefore, it may be desirable to detect BSEs with medium emission angles using a technique that improves the detection efficiency, while maintaining the high imaging resolution.

Some embodiments of the present disclosure are directed to electron beam apparatuses and methods of forming an image of a sample. The apparatus may include an electron detector located immediately upstream from a polepiece of an objective lens along the primary beam optical axis. The polepiece may be electrically grounded and therefore, protect the signal electron detector from being exposed to the electrostatic field near the sample. This may enable an enhancement in resolution because the working distance may be reduced while reducing or even eliminating the risk of electrical damage to the detector. Some embodiments are directed to an electron beam apparatus comprising a beam manipulator such as a beam deflector located between the signal electron detector and the sample. Such a configuration may allow for large field-of-view (FOV) suitable for large-area, high throughput sample scanning, while maintaining high resolution and high image quality.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
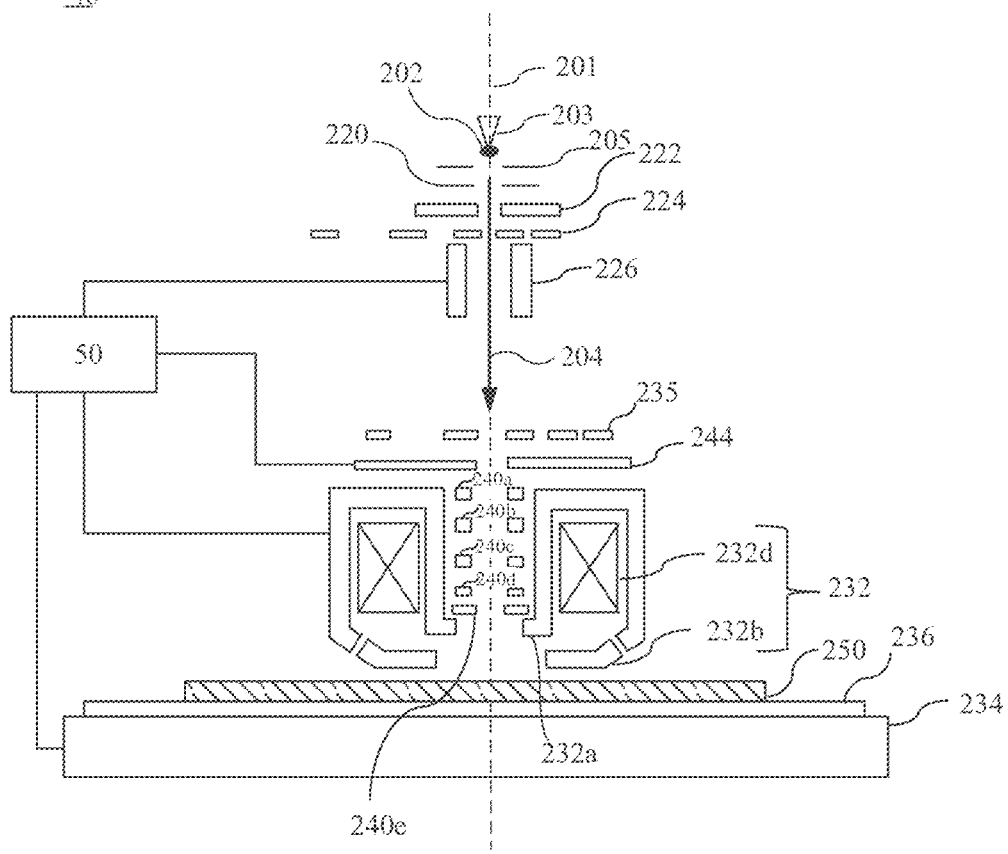
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary configuration of electron beam tool 40 that can be a part of the exemplary charged particle beam inspection system 100 of FIG. 1, consistent with embodiments of the present disclosure. Electron beam tool 40 (also referred to herein as apparatus 40) may comprise an electron emitter, which may comprise a cathode 203, an extractor electrode 205, a gun aperture 220, and an anode 222. Electron beam tool 40 may further include a Coulomb aperture array 224, a condenser lens 226, a beam-limiting aperture array 235, an objective lens assembly 232, and an electron detector 244. Electron beam tool 40 may further include a sample holder 236 supported by motorized stage 234 to hold a sample 250 to be inspected. It is to be appreciated that other relevant components may be added or omitted, as needed.

In some embodiments, electron emitter may include cathode 203, an anode 222, wherein primary electrons can be emitted from the cathode and extracted or accelerated to form a primary electron beam 204 that forms a primary beam crossover 202. Primary electron beam 204 can be visualized as being emitted from primary beam crossover 202.

In some embodiments, the electron emitter, condenser lens 226, objective lens assembly 232, beam-limiting aperture array 235, and electron detector 244 may be aligned with a primary optical axis 201 of apparatus 40. In some embodiments, electron detector 244 may be placed off primary optical axis 201, along a secondary optical axis (not shown).

Objective lens assembly 232, in some embodiments, may comprise a modified swing objective retarding immersion lens (SORIL), which includes a pole piece 232a, a control electrode 232b, a beam manipulator assembly comprising deflectors 240a, 240b, 240d, and 240e, and an exciting coil 232d. In a general imaging process, primary electron beam 204 emanating from the tip of cathode 203 is accelerated by an accelerating voltage applied to anode 222. A portion of primary electron beam 204 passes through gun aperture 220, and an aperture of Coulomb aperture array 224, and is focused by condenser lens 226 so as to fully or partially pass through an aperture of beam-limiting aperture array 235. The electrons passing through the aperture of beam-limiting aperture array 235 may be focused to form a probe spot on the surface of sample 250 by the modified SORIL lens and deflected to scan the surface of sample 250 by one or more deflectors of the beam manipulator assembly. Secondary electrons emanated from the sample surface may be collected by electron detector 244 to form an image of the scanned area of interest.

In objective lens assembly 232, exciting coil 232d and pole piece 232a may generate a magnetic field. A part of sample 250 being scanned by primary electron beam 204 can be immersed in the magnetic field and can be electrically charged, which, in turn, creates an electric field. The electric field may reduce the energy of impinging primary electron beam 204 near and on the surface of sample 250. Control electrode 232b, being electrically isolated from pole piece 232a, may control, for example, an electric field above and on sample 250 to reduce aberrations of objective lens assembly 232 and control focusing situation of signal electron beams for high detection efficiency, or avoid arcing to protect sample. One or more deflectors of beam manipulator assembly may deflect primary electron beam 204 to facilitate beam scanning on sample 250. For example, in a scanning process, deflectors 240a, 240b, 240d, and 240e can be controlled to deflect primary electron beam 204, onto different locations of top surface of sample 250 at different time points, to provide data for image reconstruction for different parts of sample 250. It is noted that the order of 240a-e may be different in different embodiments.

Backscattered electrons (BSEs) and secondary electrons (SEs) can be emitted from the part of sample 250 upon receiving primary electron beam 204. A beam separator 240c can direct the secondary or scattered electron beam(s), comprising backscattered and secondary electrons, to a sensor surface of electron detector 244. The detected secondary electron beams can form corresponding beam spots on the sensor surface of electron detector 244. Electron detector 244 can generate signals (e.g., voltages, currents) that represent the intensities of the received secondary electron beam spots, and provide the signals to a processing system, such as controller 50. The intensity of secondary or backscattered electron beams, and the resultant secondary electron beam spots, can vary according to the external or internal structure of sample 250. Moreover, as discussed above, primary electron beam 204 can be deflected onto different locations of the top surface of sample 250 to generate secondary or scattered electron beams (and the resultant beam spots) of different intensities. Therefore, by mapping the intensities of the secondary electron beam spots with the locations of sample 250, the processing system can reconstruct an image that reflects the internal or external structures of wafer sample 250.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detector 244 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detector 244 and may construct an image. The image acquirer may thus acquire images of regions of sample 250. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, controller 50 may include measurement circuitries (e.g., analog-to-digital converters) to obtain a distribution of the detected secondary electrons and backscattered electrons. The electron distribution data collected during a detection time window, in combination with corresponding scan path data of a primary beam 204 incident on the sample (e.g., a wafer) surface, can be used to reconstruct images of the wafer structures under inspection. The reconstructed images can be used to reveal various features of the internal or external structures of sample 250, and thereby can be used to reveal any defects that may exist in the wafer.

In some embodiments, controller 50 may control motorized stage 234 to move sample 250 during inspection. In some embodiments, controller 50 may enable motorized stage 234 to move sample 250 in a direction continuously at a constant speed. In other embodiments, controller 50 may enable motorized stage 234 to change the speed of the movement of sample 250 over time depending on the steps of scanning process.

As is commonly known in the art, interaction of charged particles, such as electrons of a primary electron beam with a sample (e.g., sample 315 of FIG. 3, discussed later), may generate signal electrons containing compositional and topographical information about the probed regions of the sample. Secondary electrons (SEs) may be identified as signal electrons with low emission energies, and backscattered electrons (BSEs) may be identified as signal electrons with high emission energies. Because of their low emission energy, an objective lens assembly may direct the SEs along electron paths and focus the SEs on a detection surface of in-lens electron detector placed inside the SEM column. BSEs traveling along electron paths may be detected by the in-lens electron detector as well. In some cases, BSEs with large emission angles, however, may be detected using additional electron detectors, such as a backscattered electron detector, or remain undetected, resulting in loss of sample information needed to inspect a sample or measure critical dimensions.

Detection and inspection of some defects in semiconductor fabrication processes, such as buried particles during photolithography, metal deposition, dry etching, or wet etching, among other things, may benefit from inspection of surface features as well as compositional analysis of the defect particle. In such scenarios, information obtained from secondary electron detectors and backscattered electron detectors to identify the defect(s), analyze the composition of the defect(s), and adjust process parameters based on the obtained information, among other things, may be desirable for a user.

The emission of SEs and BSEs obeys Lambert's law and has a large energy spread. SEs and BSEs are generated upon interaction of primary electron beam with the sample, from different depths of the sample and have different emission energies. For example, secondary electrons originate from the surface and may have an emission energy ≤50 eV, depending on the sample material, or volume of interaction, among other things. SEs are useful in providing information about surface features or surface geometries. BSEs, on the other hand, are generated by predominantly elastic scattering events of the incident electrons of the primary electron beam and typically have higher emission energies in comparison to SEs, in a range from 50 eV to approximately the landing energy of the incident electrons, and provide compositional and contrast information of the material being inspected. The number of BSEs generated may depend on factors including, but are not limited to, atomic number of the material in the sample, acceleration voltage of primary electron beam, among other things.

Based on the difference in emission energy, or emission angle, among other things, SEs and BSEs may be separately detected using separate electron detectors, segmented electron detectors, energy filters, and the like. For example, an in-lens electron detector may be configured as a segmented detector (discussed later in reference to FIG. 11) comprising multiple segments arranged in a two-dimensional or a three-dimensional arrangement. In some cases, the segments of in-lens electron detector may be arranged radially, circumferentially, or azimuthally around a primary optical axis (e.g., primary optical axis 300-1 of FIG. 3).

Figure 3:
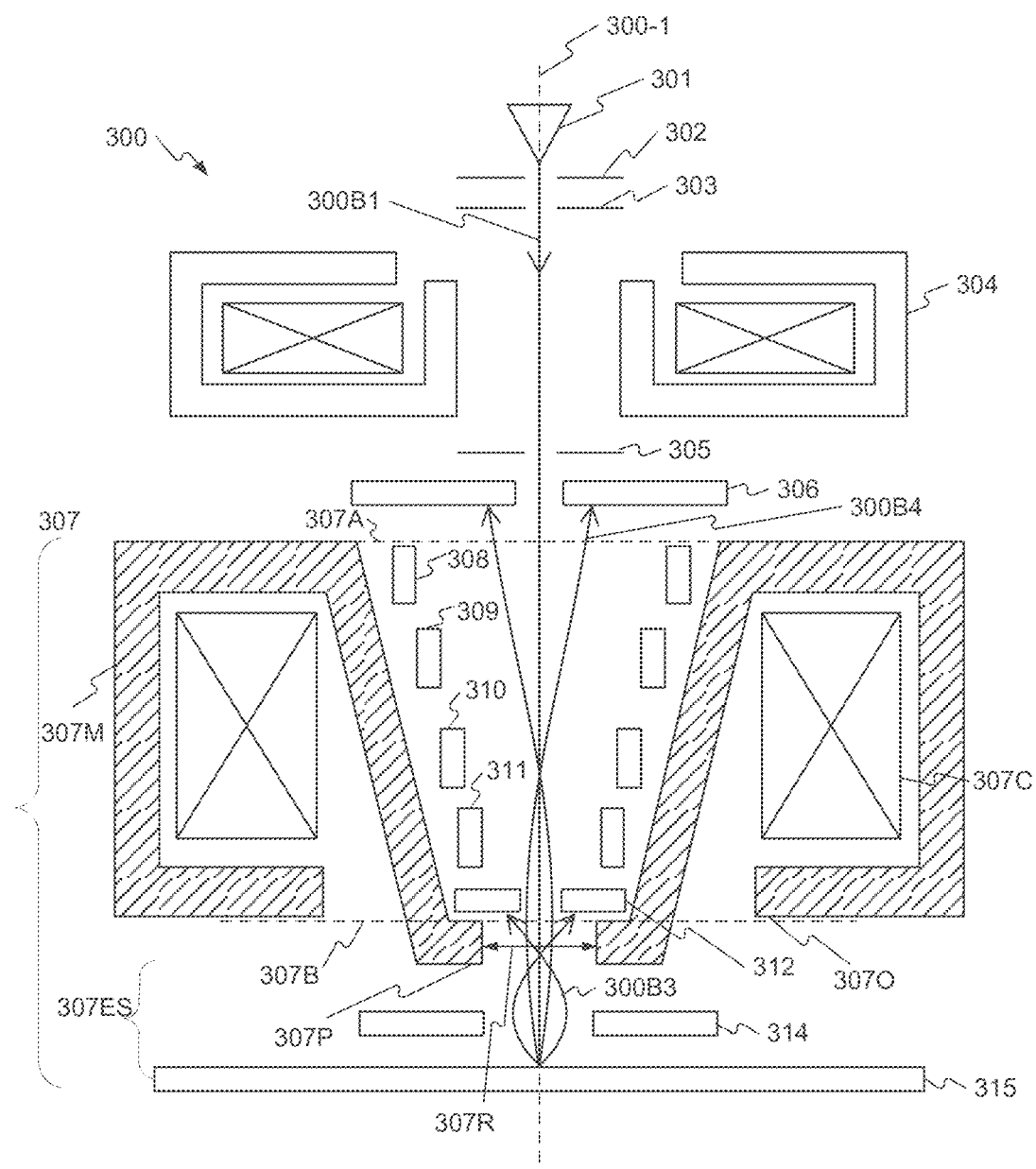
FIG. 3 is a schematic diagram of an exemplary charged-particle beam apparatus comprising a charged-particle detector, consistent with embodiments of the present disclosure.

Reference is now made to FIG. 3, which illustrates a schematic diagram of an exemplary charged-particle beam apparatus 300 (also referred to as apparatus 300), consistent with embodiments of the present disclosure, Apparatus 300 may comprise a charged-particle source such as, an electron source configured to emit primary electrons from a cathode 301 and extracted using an extractor electrode 302 to form a primary electron beam 300B1 along a primary optical axis 300-1. Apparatus 300 may further comprise an anode 303, a condenser lens 304, a beam-limiting aperture array 305, signal electron detectors 306 and 312, a compound objective lens 307, a scanning deflection unit comprising primary electron beam deflectors 308, 309, 310, and 311, and a control electrode 314. In the context of this disclosure, one or both of signal electron detectors 306 and 312 may be in-lens electron detectors located inside the electron-optical column of a SEM and may be arranged rotationally symmetric around primary optical axis 300-1. In some embodiments, signal electron detector 312 may be referred to as a first electron detector, and signal electron detector 306 may be referred to as through-the-lens detector, immersion lens detector, upper detector, or second electron detector. It is to be appreciated that relevant components may be added, omitted, or reordered, as appropriate.

An electron source (not shown) may include a thermionic source configured to emit electrons upon being supplied thermal energy to overcome the work function of the source, a field emission source configured to emit electrons upon being exposed to a large electrostatic field, etc. In the case of a field emission source, the electron source may be electrically connected to a controller, such as controller 50 of FIG. 2, configured to apply and adjust a voltage signal based on a desired landing energy, sample analysis, source characteristics, among other things. Extractor electrode 302 may be configured to extract or accelerate electrons emitted from a field emission gun, for example, to form primary electron beam 300I31 that forms a virtual or a real primary beam crossover (not illustrated) along primary optical axis 300-1. Primary electron beam 300B1 may be visualized as being emitted from the primary beam crossover. In some embodiments, controller 50 may be configured to apply and adjust a voltage signal to extractor electrode 302 to extract or accelerate electrons generated from electron source. An amplitude of the voltage signal applied to extractor electrode 302 may be different from the amplitude of the voltage signal applied to cathode 301. In some embodiments, the difference between the amplitudes of the voltage signal applied to extractor electrode 302 and to cathode 301 may be configured to accelerate the electrons downstream along primary optical axis 300-1 while maintaining the stability of the electron source. As used in the context of this disclosure, "downstream" refers to a direction along the path of primary electron beam 300B1 starting from the electron source towards sample 315. With reference to positioning of an element of a charged-particle beam apparatus (e.g., apparatus 300 of FIG. 3), "downstream" may refer to a position of an element located below or after another element, along the path of primary electron beam starting from the electron source, and "immediately downstream" refers to a position of a second element below or after a first element along the path of primary electron beam 300B1 such that there are no other active elements between the first and the second element. For example, as illustrated in FIG. 3, signal electron detector 306 may be positioned immediately downstream of beam-limiting aperture array 305 such that there are no other optical or electron-optical elements placed between beam-limiting aperture array 305 and electron detector 306. As used in the context of this disclosure, "upstream" may refer to a position of an element located above or before another element, along the path of primary electron beam starting from the electron source, and "immediately upstream" refers to a position of a second element above or before a first element along the path of primary electron beam 300B1 such that there are no other active elements between the first and the second element. As used herein, "active element" may refer to any element or component, the presence of which may modify the electromagnetic field between the first and the second element, either by generating an electric field, a magnetic field, or an electromagnetic field.

Apparatus 300 may comprise condenser lens 304 configured to receive a portion of or a substantial portion of primary electron beam 300B1 and to focus primary electron beam 300B1 on beam-limiting aperture array 305. Condenser lens 304 may be substantially similar to condenser lens 226 of FIG. 2 and may perform substantially similar functions. Although shown as a magnetic lens in FIG. 3, condenser lens 304 may be an electrostatic, a magnetic, an electromagnetic, or a compound electromagnetic lens, among others. Condenser lens 304 may be electrically coupled with controller 50, as illustrated in FIG. 2. Controller 50 may apply an electrical excitation signal to condenser lens 304 to adjust the focusing power of condenser lens 304 based on factors including, but are not limited to, operation mode, application, desired analysis, sample material being inspected, among other things.

Apparatus 300 may further comprise beam-limiting aperture array 305 configured to limit beam current of primary electron beam 300B1 passing through one of a plurality of beam-limiting apertures of beam-limiting aperture array 305. Although, only one beam-limiting aperture is illustrated in FIG. 3, beam-limiting aperture array 305 may include any number of apertures having uniform or non-uniform aperture size, cross-section, or pitch. In some embodiments, beam-limiting aperture array 305 may be disposed downstream of condenser lens 304 or immediately downstream of condenser lens 304 (as illustrated in FIG. 3) and substantially perpendicular to primary optical axis 300-1. In some embodiments, beam-limiting aperture array 305 may be configured as an electrically conducting structure comprising a plurality of beam-limiting apertures. Beam-limiting aperture array 305 may be electrically connected via a connector (not illustrated) with controller 50, which may be configured to instruct that a voltage be supplied to beam-limiting aperture array 305. The supplied voltage may be a reference voltage such as, for example, ground potential. Controller 50 may also be configured to maintain or adjust the supplied voltage. Controller 50 may configured to adjust the position of beam-limiting aperture array 305.

Apparatus 300 may comprise one or more signal electron detectors 306 and 312. Signal electron detectors 306 and 312 may be configured to detect substantially all secondary electrons and a portion of backscattered electrons based on the emission energy, emission polar angle, emission azimuthal angle of the backscattered electrons, among other things. In some embodiments, signal electron detectors 306 and 312 may be configured to detect secondary electrons, backscattered electrons, or auger electrons. Signal electron detector 312 may be disposed downstream of signal electron detector 306. In some embodiments, signal electron detector 312 may be disposed downstream or immediately downstream of primary electron beam deflector 311. Signal electrons having low emission energy (typically ≤50 eV) or small emission polar angles, emitted from sample 315 may comprise secondary electron beam(s) 300B4, and signal electrons having high emission energy (typically >50 eV) and medium emission polar angles may comprise backscattered electron beam(s) 300B3. In some embodiments, 300B4 may comprise secondary electrons, low-energy backscattered electrons, or high-energy backscattered electrons with small emission polar angles. It is appreciated that although not illustrated, a portion of backscattered electrons may be detected by signal electron detector 306, and a portion of secondary electrons may be detected by signal electron detector 312. In overlay metrology and inspection applications, signal electron detector 306 may be useful to detect secondary electrons generated from a surface layer and backscattered electrons generated from the underlying deeper layers, such as deep trenches or high aspect-ratio holes.

Apparatus 300 may further include compound objective lens 307 configured to focus primary electron beam 300B1 on a surface of sample 315. Controller 50 may apply an electrical excitation signal to the coils 307C of compound objective lens 307 to adjust the focusing power of compound objective lens 307 based on factors including, but are not limited to, primary beam energy, application need, desired analysis, sample material being inspected, among other things. Compound objective lens 307 may be further configured to focus signal electrons, such as secondary electrons having low emission energies, or backscattered electrons having high emission energies, on a detection surface of a signal electron detector (e.g., in-lens signal electron detector 306 or detector 312). Compound objective lens 307 may be substantially similar to or perform substantially similar functions as objective lens assembly 232 of FIG. 2. In some embodiments, compound objective lens 307 may comprise an electromagnetic lens including a magnetic lens 307M, and an electrostatic lens 307ES formed by control electrode 314, polepiece 307P, and sample 315.

As used herein, a compound objective lens is an objective lens producing overlapping magnetic and electrostatic fields, both in the vicinity of the sample for focusing the primary electron beam. In this disclosure, though condenser lens 304 may also be a magnetic lens, a reference to a magnetic lens, such as 307M, refers to an objective magnetic lens, and a reference to an electrostatic lens, such as 307ES, refers to an objective electrostatic lens. As illustrated in FIG. 3, magnetic lens 307M and electrostatic lens 307ES, working in unison, for example, to focus primary electron beam 300B1 on sample 315, may form compound objective lens 307. The lens body of magnetic lens 307M and coil 307C may produce the magnetic field, while the electrostatic field may be produced by creating a potential difference, for example, between sample 315, and polepiece 307P. In some embodiments, control electrode 314 or other electrodes located between pole 307P and sample 315, may also be a part of electrostatic lens 307ES.

In some embodiments, magnetic lens 307M may comprise a cavity defined by the space between imaginary planes 307A and 307B. It is to be appreciated that imaginary planes 307A and 3079, marked as broken lines in FIG. 3, are visual aids for illustrative purposes only. Imaginary plane 307A, located closer to condenser lens 304, may define the upper boundary of the cavity, and imaginary plane 307I, located closer to sample 315, may define the lower boundary of the cavity of magnetic lens 307M. As used herein, the "cavity" of the magnetic lens refers to space defined by the element of the magnetic lens configured to allow passage of the primary electron beam, wherein the space is rotationally symmetric around the primary optical axis. The term "within the cavity of magnetic lens" or "inside the cavity of the magnetic lens" refers to the space bound within the imaginary planes 307A and 307I and the internal surface of the magnetic lens 307M directly exposed to the primary electron beam. Planes 307A and 307I may be substantially perpendicular to primary optical axis 300-1. Although FIGS. 3-10 illustrate a conical cavity, the cross-section of the cavity may be cylindrical, conical, staggered cylindrical, staggered conical, or any suitable cross-section.

Apparatus 300 may further include a scanning deflection unit comprising primary electron beam deflectors 308, 309, 310, and 311, configured to dynamically deflect primary electron beam 300B1 on a surface of sample 315. In some embodiments, scanning deflection unit comprising primary electron beam deflectors 308, 309, 310, and 311 may be referred to as a beam manipulator or a beam manipulator assembly. The dynamic deflection of primary electron beam 300B1 may cause a desired area or a desired region of interest of sample 315 to be scanned, for example in a raster scan pattern, to generate SEs and BSEs for sample inspection. One or more primary electron beam deflectors 308, 309, 310, and 311 may be configured to deflect primary electron beam 300B1 in X-axis or Y-axis, or a combination of X- and Y-axes. As used herein, X-axis and Y-axis form Cartesian coordinates, and primary electron beam 300B1 propagates along Z-axis or primary optical axis 300-1.

Electrons are negatively charged particles and travel through the electron-optical column, and may do so at high energy and high speeds. One way to deflect the electrons is to pass them through an electric field or a magnetic field generated, for example, by a pair of plates held at two different potentials, or passing current through deflection coils, among other techniques. Varying the electric field or the magnetic field across a deflector (e.g., primary electron beam deflectors 308, 309, 310, and 311 of FIG. 3) may vary the deflection angle of electrons in primary electron beam 300B1 based on factors including, but are not limited to, electron energy, magnitude of the electric field applied, dimensions of deflectors, among other things.

In some embodiments, one or more primary electron beam deflectors 308, 309, 310, and 311 may be located within the cavity of magnetic lens 307M. As illustrated in FIG. 3, all primary electron beam deflectors 308, 309, 310, and 311, in their entirety, may be located within the cavity of magnetic lens 307M. In some embodiments, at least one primary electron beam deflector, in its entirety, may be located within the cavity of magnetic lens 307M. In some embodiments, a substantial portion of the magnetic field generated by passing electrical current through coil 307C may be present in magnetic lens 307M such that each deflector is located inside the magnetic field lines of magnetic lens 307M or is influenced by the magnetic field of magnetic lens 307M. In such a scenario, sample 315 may be considered to be outside the magnetic field lines and may not be influenced by the magnetic field of magnetic lens 307M. A beam deflector (e.g., primary electron beam deflector 308 of FIG. 3) may be disposed circumferentially along the inner surface of magnetic lens 307M. One or more primary electron beam deflectors may be placed between signal electron detectors 306 and 312. In some embodiments, all primary electron beam deflectors may be placed between signal electron detectors 306 and 312.

As disclosed herein, a polepiece of a magnetic lens (e.g., magnetic lens 307M) is a piece of magnetic material near the magnetic poles of a magnetic lens, while a magnetic pole is the end of the magnetic material where the external magnetic field is the strongest. As illustrated in FIG. 3, apparatus 300 comprises polepieces 307P and 307O. As an example, polepiece 307P may be the piece of magnetic material near the north pole of magnetic lens 307M, and polepiece 307O may be the piece of magnetic material near the south pole of magnetic lens 307M. When the current in magnetic lens coil 307C changes directions, then the polarity of the magnetic poles may also change. In the context of this disclosure, the positioning of electron detectors (e.g., signal electron detector 312 of FIG. 3, or signal electron detector 413 of FIG. 4), beam deflectors (e.g., beam deflectors 308-311 of FIG. 3), electrodes (e.g., control electrode 314 of FIG. 3) may be described with reference to the position of polepiece 307P located closest to the point where primary optical axis 300-1 intersects sample 315.

Polepiece 307P of magnetic lens 307M may comprise a magnetic pole made of a soft magnetic material, such as electromagnetic iron, which concentrates the magnetic field substantially within the cavity of magnetic lens 307M. Polepieces 307P and 307O may be high-resolution polepieces, multiuse polepieces, or high-contrast polepieces, for example.

As illustrated in FIG. 3, polepiece 307P may comprise an opening 307R configured to allow primary electron beam 300B1 to pass through and allow signal electrons to reach signal detectors 306 and 312. Opening 307R of polepiece 307P may be circular, substantially circular, or non-circular in cross-section. In some embodiments, the geometric center of opening 307R of polepiece 307P may be aligned with primary optical axis 300-1. In some embodiments, as illustrated in FIG. 3, polepiece 307P may be the furthest downstream horizontal section of magnetic lens 307M, and may be substantially parallel to a plane of sample 315. Polepieces (e.g., 307P and 307O) are one of several distinguishing features of magnetic lens over electrostatic lens. Because polepieces are magnetic components adjacent to the magnetic poles of a magnetic lens, and because electrostatic lenses do not produce a magnetic field, electrostatic lenses do not have polepieces.

One of several ways to separately detect signal electrons such as SEs and BSEs based on their emission energy includes passing the signal electrons generated from probe spots on sample 315 through an energy filtering device. In some embodiments, control electrode 314 may be configured to function as an energy filtering device and may be disposed between sample 315 and signal electron detector 312. In some embodiments, control electrode 314 may be disposed between sample 315 and magnetic lens 307M along the primary optical axis 300-1. Control electrode 314 may be biased with reference to sample 315 to form a potential barrier for the signal electrons having a threshold emission energy. For example, control electrode 314 may be biased negatively with reference to sample 315 such that a portion of the negatively charged signal electrons having energies below the threshold emission energy may be deflected back to sample 315. As a result, only signal electrons that have emission energies higher than the energy barrier formed by control electrode 314 propagate towards signal electron detector 312. It is appreciated that control electrode 314 may perform other functions as well, for example, affecting the angular distribution of detected signal electrons on signal electron detectors 306 and 312 based on a voltage applied to control electrode (discussed later in reference to FIGS. 7A-7B and 8A-8B). In some embodiments, control electrode 314 may be electrically connected via a connector (not illustrated) with controller 50 which may be configured to apply a voltage to control electrode 314. Controller 50 may also be configured to apply, maintain, or adjust the applied voltage. In some embodiments, control electrode 314 may comprise one or more pairs of electrodes configured to provide more flexibility of signal control to, for example, adjust the trajectories of signal electrons emitted from sample 315.

In some embodiments, sample 315 may be disposed on a plane substantially perpendicular to primary optical axis 300-1. The position of the plane of sample 315 may be adjusted along primary optical axis 300-1 such that a distance between sample 315 and signal electron detector 312 may be adjusted. In some embodiments, sample 315 may be electrically connected via a connector (not illustrated) with controller 50 which may be configured to supply a voltage to sample 315. Controller 50 may also be configured to maintain or adjust the supplied voltage.

In currently existing SEMs, signals generated by detection of secondary electrons and backscattered electrons are used in combination for imaging surfaces, detecting and analyzing defects, obtaining topographical information, morphological and compositional analysis, among other things. By detecting the secondary electrons and backscattered electrons, the top few layers and the layers underneath may be imaged simultaneously, thus potentially capturing underlying defects, such as buried particles, overlay errors, among other things. However, overall image quality may be affected by the efficiency of detection of secondary electrons as well as backscattered electrons. While high-efficiency secondary electron detection may provide high-quality images of the surface, the overall image quality may be inadequate because of inferior backscattered electron detection efficiency. Therefore, it may be beneficial to improve backscattered electron detection efficiency to obtain high-quality imaging, while maintaining high throughput.

As illustrated in FIG. 3, apparatus 300 may comprise signal electron detector 312 located immediately upstream of polepiece 307P and within the cavity of magnetic lens 307M. Signal electron detector 312 may be placed between primary electron beam deflector 311 and polepiece 307P. In some embodiments, signal electron detector 312 may be placed within the cavity of magnetic lens 307M such that there are no primary electron beam deflectors between signed electron detector 312 and sample 315.

In some embodiments, polepiece 307P may be electrically grounded or maintained at ground potential to minimize the influence of the retarding electrostatic field associated with sample 315 on signal electron detector 312, therefore minimizing the electrical damage, such as arcing, that may be caused to signal electron detector 312. In a configuration such as shown in FIG. 3, the distance between signal electron detector 312 and sample 315 may be reduced so that the BSE detection efficiency and the image quality may be enhanced while minimizing the occurrence of electrical failure or damage to signal electron detector 312.

In some embodiments, signal electron detectors 306 and 312 may be configured to detect signal electrons having a wide range of emission polar angles and emission energies. For example, because of the proximity of signal electron detector 312 to sample 315, it may be configured to collect backscattered electrons having a wide range of emission polar angles, and signal electron detector 306 may be configured to collect or detect secondary electrons having low emission energies.

Signal electron detector 312 may comprise an opening configured to allow passage of primary electron beam 300B1 and signal electron beam 300B4. In some embodiments, the opening of signal electron detector 312 may be aligned such that a central axis of the opening may substantially coincide with primary optical axis 300-1. The opening of signal electron detector 312 may be circular, rectangular, elliptical, or any other suitable shape. In some embodiments, the size of the opening of signal electron detector 312 may be chosen, as appropriate. For example, in some embodiments, the size of the opening of signal electron detector 312 may be smaller than the opening of polepiece 307P close to sample 315. In some embodiments, where the signal electron detector 306 is a single-channel detector, the opening of signal electron detector 312 and the opening of signal electron detector 306 may be aligned with each other and with primary optical axis 300-1. In some embodiments, signal electron detector 306 may comprise a plurality of electron detectors, or one or more electron detectors having a plurality of detection channels. In embodiments where the signal electron detector 306 comprises a plurality of electron detectors, one or more detectors may be located off-axis with respect to primary optical axis 300-1. In the context of this disclosure, "off-axis" may refer to the location of an element such as a detector, for example, such that the primary axis of the element forms a non-zero angle with the primary optical axis of the primary electron beam. In some embodiments, the signal electron detector 306 may further comprise an energy filter configured to allow a portion of incoming signal electrons having a threshold energy to pass through and be detected by the electron detector.

The location of signal electron detector 312 within the cavity of magnetic lens 307M as shown in FIG. 3 may further enable easier assembly and alignment of signal electron detector 312 with other electron-optical components of apparatus 300, Electrically grounded polepiece 307P may substantially shield signal electron detector 312 from the influence of the retarding electrostatic field of electrostatic lens 307ES formed by polepiece 307P, control electrode 314, and sample 315.

One of several ways to enhance image quality and signal-to-noise ratio may include detecting more, backscattered electrons emitted from the sample. The angular distribution of emission of backscattered electrons may be represented by a cosine dependence of the emission polar angle ($\cos(\Theta)$, where $\Theta$ is the emission polar angle between the backscattered electron beam and the primary optical axis), While a signal electron detector may efficiently detect backscattered electrons of medium emission polar angles, the large emission polar angle backscattered electrons may remain undetected or inadequately detected to contribute towards the overall imaging quality. Therefore, it may be desirable to add another signal electron detector to capture large angle backscattered electrons.

Figure 4:
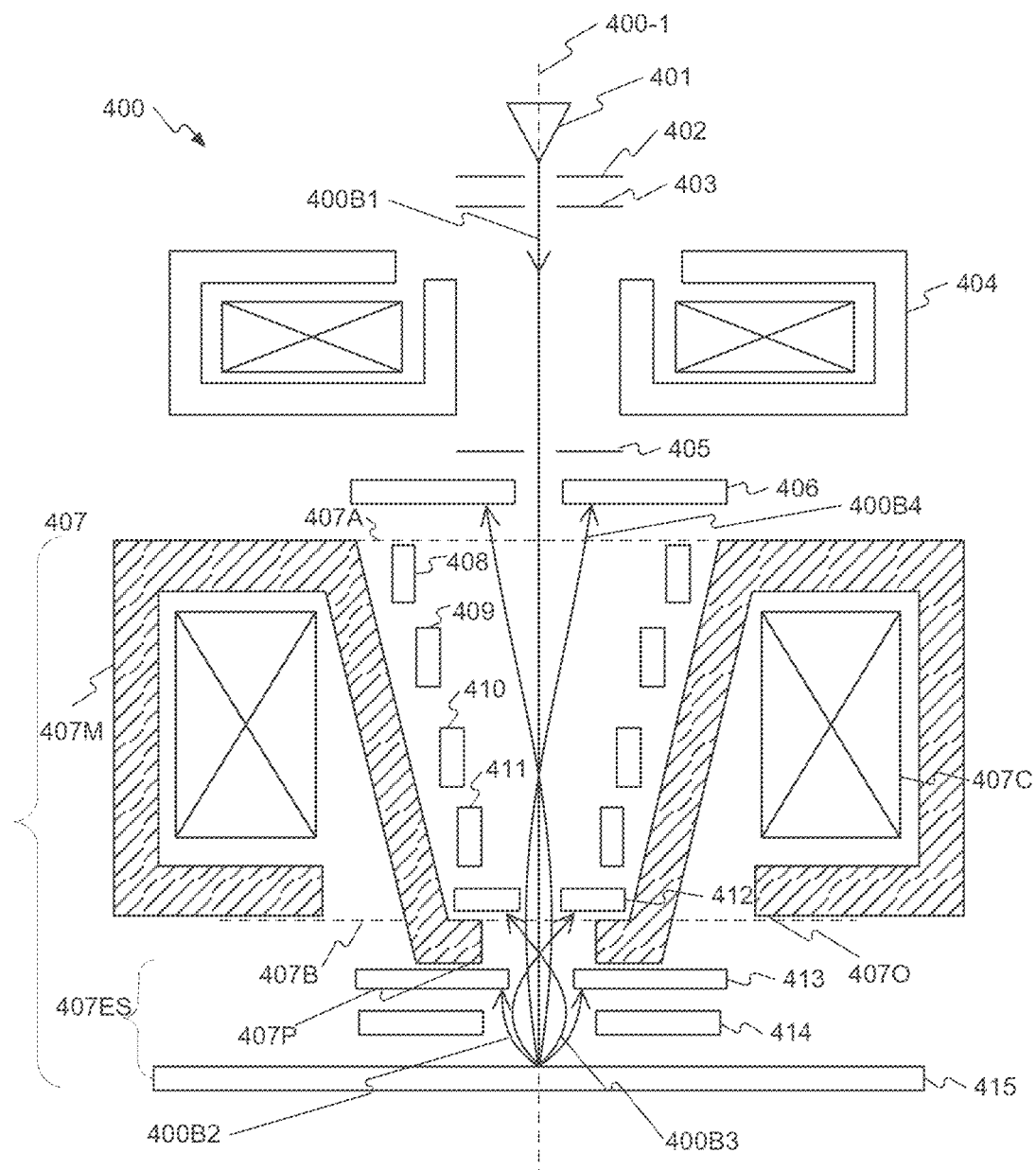
FIG. 4 is a schematic diagram of an exemplary charged-particle beam apparatus comprising a plurality of charged-particle detectors, consistent with embodiments of the present disclosure.

Reference is now made to FIG. 4, which illustrates a schematic diagram of an exemplary charged-particle beam apparatus 400 (also referred to as apparatus 400), consistent with embodiments of the present disclosure. In comparison to apparatus 300, apparatus 400 may comprise a signal electron detector 413, in addition to signal electron detectors 406 and 412 (analogous to signal electron detectors 306 and 312 of FIG. 3). Signal electron beam 400B4 may comprise low energy secondary electrons and low emission angle backscattered electrons, signal electron beam 400B3 may comprise medium emission angle backscattered electrons, and signal electron beam 400B2 may comprise large emission angle backscattered electrons.

In some embodiments, signal electron detector 413 may comprise a signal electron detector located between signal electron detector 412 and control electrode 414. In some embodiments, signal electron detector 413 may be located within the cavity of magnetic lens 407M and downstream of signal electron detector 412. In some embodiments, signal electron detector 413 may be located immediately downstream and outside of polepiece 407P, as shown in FIG. 4. In a configuration where signal electron detector 413 is outside polepiece 407P, it may be desirable to place signal electron detector 413 closer towards polepiece 407P or farther from control electrode 414, but aligned with primary optical axis 400-1 to minimize the electrical damage to signal electron detector 413 caused by arcing, for example.

In some embodiments, an opening of signal electron detector 413 may be larger than the opening of signal electron detector 412. Such a configuration may allow capturing a larger range of emission angles and emission energies of backscattered electrons, while utilizing all three signal electron detectors 406, 412, and 413 to improve BSE detection efficiency. The relative sizes of the openings of signal electron detectors 412, and 413 may affect the detection or collection distribution of signal electrons generated from sample 415. It is appreciated that the size of the opening of signal electron detectors 412 and 413 may be designed, as appropriate.

Figure 5:
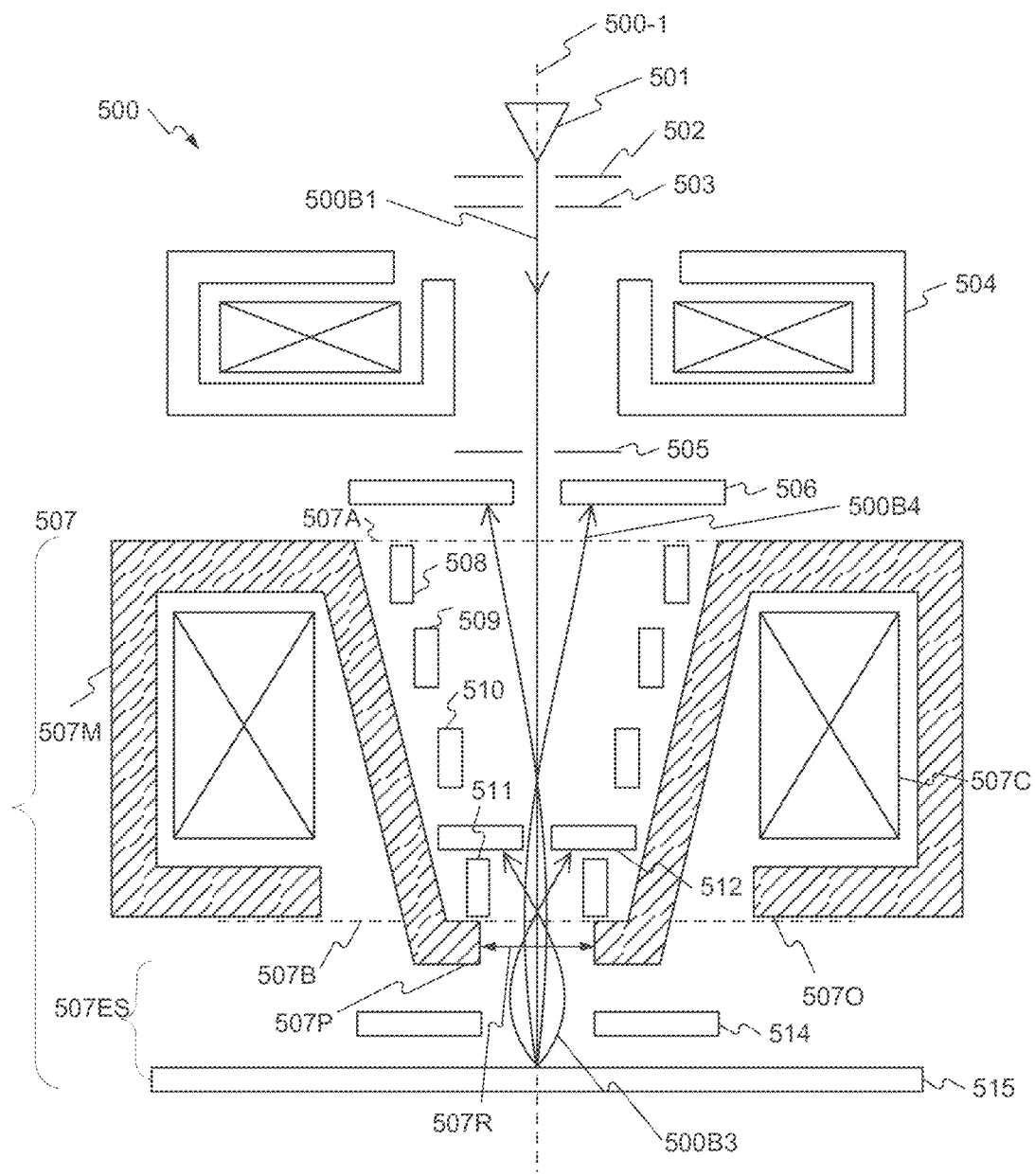
FIG. 5 is a schematic diagram of an exemplary charged-particle beam apparatus comprising a plurality of charged-particle detectors, consistent with embodiments of the present disclosure.

Reference is now made to FIG. 5, which illustrates a schematic diagram of an exemplary charged-particle beam apparatus 500 (also referred to as apparatus 500), consistent with embodiments of the present disclosure. In comparison to apparatus 300, signal electron detector 512 (analogous to signal electron detector 312 of FIG. 3) may be placed immediately upstream of primary electron beam deflector 511 (analogous to primary electron beam deflector 311 of FIG. 3).

Apparatus 500 may comprise signal electron detector 512 located immediately upstream of polepiece 507P of magnetic lens 507M and within the cavity of magnetic lens 507M, and a beam manipulator (e.g., primary electron beam deflectors 508-511) configured to deflect primary electron beam 500B1 onto a surface of sample 515. Beam deflector 511 may be located between signal electron detector 512 and polepiece 507P, and within the cavity of magnetic lens 507M. In some embodiments, signal electron detector 512 may be placed between primary electron beam deflectors 510 and 511. In some embodiments, signed electron detector 512 may be placed closer to primary electron beam deflector 511 than primary electron beam deflector 510 such that it is closer to sample 515, (analogous to sample 315 and 415 of FIGS. 3 and 4, respectively) to enable high BSE collection efficiency.

One or more primary electron beam deflectors may be used to deflect the primary incident electron beam. Deflecting the primary electron beam may result in expansion of the field-of-view (FOV) and a deterioration of the beam spot size due to off-axis aberrations such as, for example, astigmatism, coma, distortion and field curvature. As a result, an optimization or an overlap of the deflection field with the magnetic lens field may be desirable to reduce off-axis aberrations due to deflection. Therefore, in the configuration shown in FIG. 5, where signal electron detector 512 is located within the cavity of magnetic lens 507M and immediately upstream of primary electron beam deflector 511 that is closest to polepiece 507P, a large FOV may be obtained.

Further, compared to apparatus 400, apparatus 500 may not comprise a third signal electron detector located between polepiece 507P and sample 515, thus allowing a reduction in the working distance between polepiece 507P and sample 515. The shorter working distance may result in higher resolution while maintaining the large FOV.

In some embodiments, an opening of signal electron detector 512 may be smaller than an opening 507R of polepiece 507P. The size of the openings of signal electron detector 512 may be chosen appropriately to adjust the detection distribution of the signal electrons among the signal electron detectors.

Figure 6:
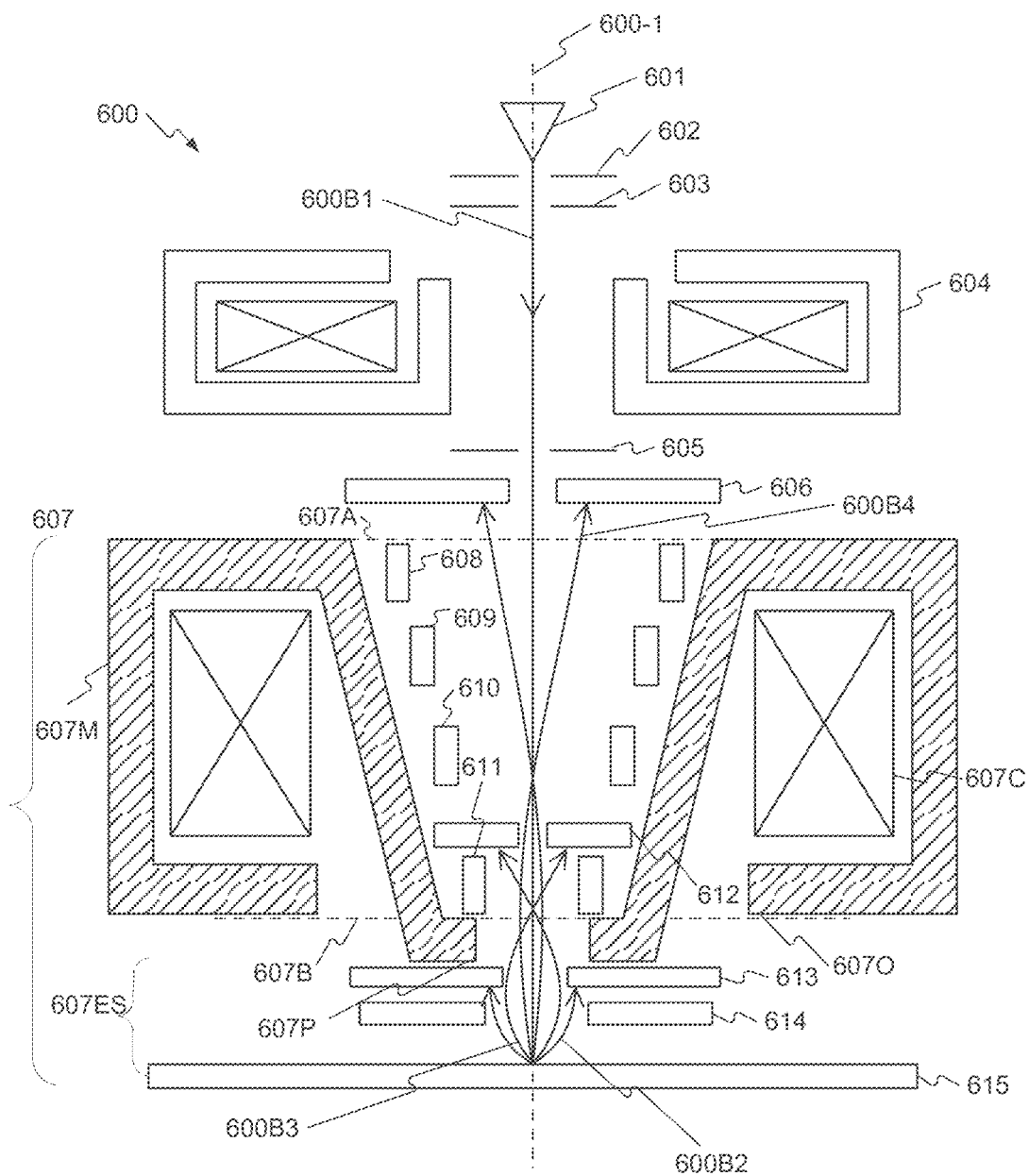
FIG. 6 is a schematic diagram of an exemplary charged-particle beam apparatus comprising a plurality of charged-particle detectors, consistent with embodiments of the present disclosure.

Reference is now made to FIG. 6, which illustrates a schematic diagram of an exemplary charged-particle beam apparatus 600 (also referred to as apparatus 600), consistent with embodiments of the present disclosure. In comparison to apparatus 500, apparatus 600 may comprise signal electron detector 613 (analogous to signal electron detector 413 of FIG. 4) in addition to signal electron detectors 606 and 612 (analogous to signal electron detectors 506 and 512 of FIG. 5).

In some embodiments, signal electron detector 613 may comprise a signal electron detector located between signal electron detector 612 and control electrode 614. In some embodiments, signal electron detector 613 may be located within the cavity of magnetic lens 607M and downstream of primary electron beam deflector 611. In some embodiments, signal electron detector 613 may be located immediately downstream from polepiece 607P and outside the cavity of magnetic lens 607M, as shown in FIG. 6. In a configuration where signal electron detector 613 is outside the cavity of magnetic lens 607M, it may be desirable to place signal electron detector 613 closer towards polepiece 607P or farther upstream from control electrode 614, but aligned with primary optical axis 600-1 to minimize the electrical damage to signal electron detector 613 caused by arcing, for example.

In some embodiments, an opening of signal electron detector 613 may be larger than the opening of signal electron detector 612. Such a configuration may allow capturing a larger range of emission angles and emission energies of backscattered electrons, while utilizing all three signal electron detectors 606, 612, and 613 to improve BSE detection efficiency. The relative sizes of the openings of signal electron detectors 612, and 613 may affect the detection or collection distribution of signal electrons generated from sample 615. It is appreciated that the size of the opening of signal electron detectors 612 and 613 may be designed, as appropriate.

The relative arrangement of signal electron detectors 612 and 613 and primary electron beam deflector 611 may result in larger FOV and higher BSE detection efficiency. In comparison to apparatus 300 of FIG. 3 or apparatus 400 of FIG. 4, the deflection field caused by primary electron beam deflector 611 may be closer to sample 615, thus producing smaller beam deflection aberrations and larger FOV.

Backscattered electron detection efficiency may be enhanced by adjusting the angular distribution of detected signal electrons across a plurality of electron detectors including the first, the second, and the third electron detector, such that substantially all the backscattered electrons generated may be captured by one or more signal electron detectors. Some of the several ways to adjust the angular distribution of emitted signal electrons, including backscattered electrons, may include adjusting the control electrode potential by varying the voltage applied to the control electrode, or adjusting the position of a signal electron detector relative to the sample, or adjusting the position of the sample along the primary optical axis, among other things. In some of the existing SEM systems, although the position of a signal electron detector closer to the sample may be adjusted relative to the sample to adjust the signal detection distribution, however, in doing so, the alignment of the signal electron detector with the primary optical axis may be negatively impacted at least due to the influence of the retarding electrostatic field associated with the sample. Therefore, it may be desirable to provide an apparatus for adjusting the signal electron distribution of emitted backscattered electrons while maintaining the alignment of signal electron detectors to the primary optical axis, Reference is now made to FIGS. 7A and 7B, which illustrate schematic diagrams of exemplary charged-particle beam apparatus 700 (also referred to as apparatus 700), consistent with embodiments of the present disclosure. Apparatus 700 may comprise signal electron detectors 706, 712, and 713, and control electrode 714 located immediately upstream of sample 715. Although signal electron detector 712 is shown as being located immediately upstream of primary electron beam deflector 711 in FIGS. 7A and 7B, it is appreciated that in some embodiments it may be located immediately downstream of primary electron beam deflector 711 as well. In some, embodiments, signal electron detectors 712 and 713 may both be located within the cavity of magnetic lens 707M.

In some embodiments, controller 50 may be configured to apply and adjust the applied voltage to control electrode 714. Adjusting the applied voltage to control electrode 714 while maintaining the voltage applied to sample 715 may cause a change in the electrostatic field near sample 715. The change in electrostatic field near sample 715 may cause a change in the trajectories of backscattered electrons emitted from sample 715, and therefore a change in their angular distribution across the plurality of signal electron detectors. In some embodiments, the plurality of signal electron detectors may include, but are not limited to, the first, the second, or the third electron detectors. In such a scenario, the landing energy of primary electron beam 700B1 may be substantially unchanged. The landing energy of a primary electron beans (e.g., 700B1) may be determined, for example, based on a difference between the voltage applied to electron source and sample.

In some embodiments, adjusting the voltage applied to control electrode 714 may also cause a separation of secondary electrons from backscattered electrons based on the emission energy. Separating the secondary electrons from backscattered electrons so that they may be detected by different signal electron detectors, or so that substantially only secondary electrons or backscattered electrons are detected at one time by a given detector, may further improve detection efficiency of each of the signal electron detectors, and therefore, improve the overall detection efficiency while maintaining the landing energy, probe current, or alignment of system components. In some embodiments, the separation of signal electrons may be dynamically adjusted by adjusting the voltage applied to control electrode 714 in runtime.

Figure 7A:
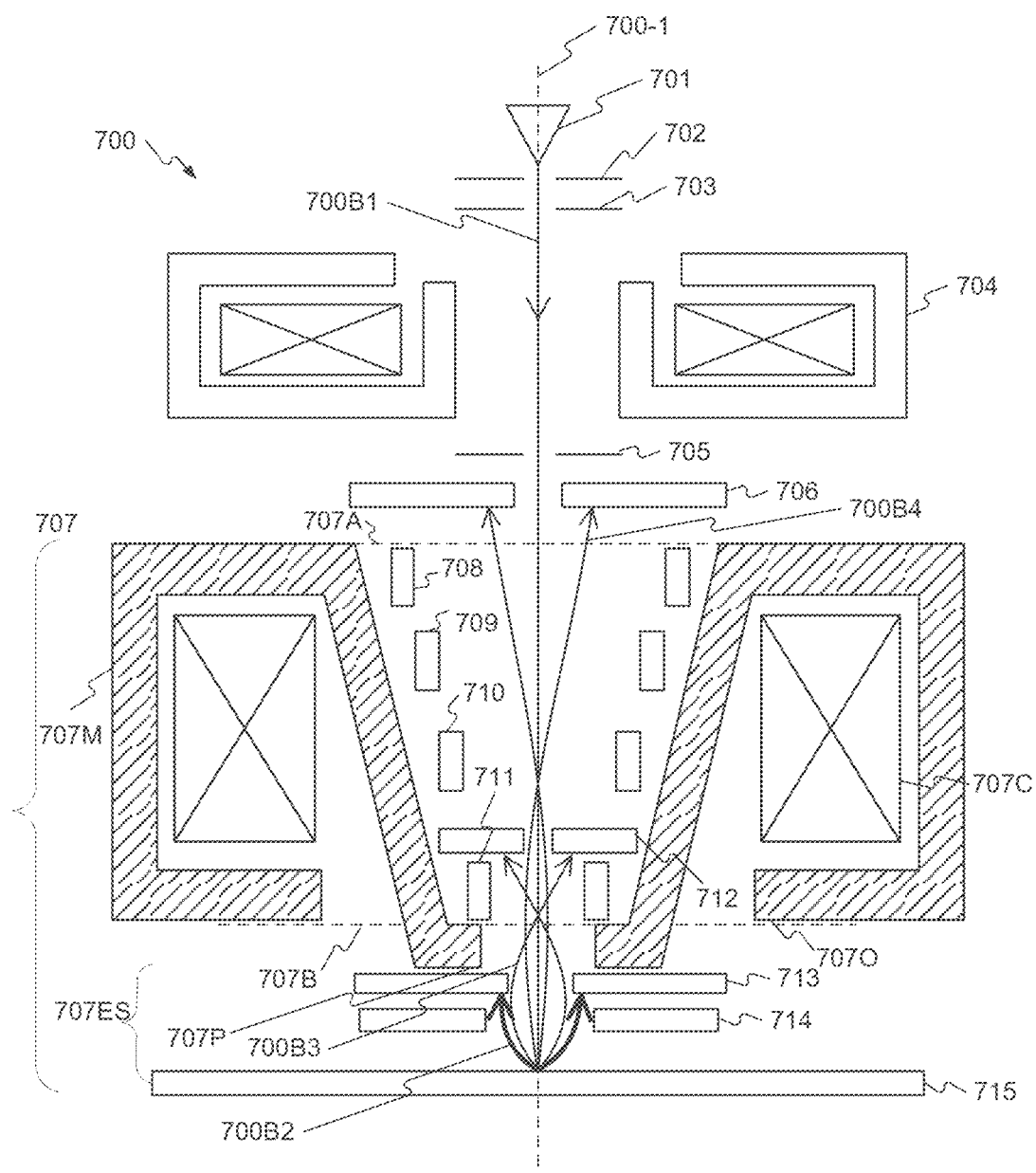
FIGS. 7A and 7B are schematic diagrams of an exemplary charged-particle beam apparatus illustrating the influence of adjustment of the voltage applied to a control electrode on angular distribution of signal electrons, consistent with embodiments of the present disclosure.

In apparatus 700 shown in FIG. 7A, a first voltage signal may be applied to control electrode 714 to cause signal electrons (e.g., secondary or backscattered electrons) having low emission angles or low emission energy to form signal electron beam 700B4, signal electrons having medium emission angles and higher emission energy to form signal electron beam 700B3, and signal electrons having large emission angles and high emission energy to form signal electron beam 700B2. As illustrated, signal electron detector 713 (analogous to signal electron detector 613 of FIG. 6) may be located outside polepiece 707P and within the electrostatic flux of electrostatic lens 707ES to capture a substantial portion of large emission angle backscattered electrons. Signal electron detector 712 may be located within the cavity of magnetic lens 707M and configured to detect a substantial portion of low or medium emission angle backscattered electrons, and signal electron detector 706 located upstream of signal electron detector 712 may be configured to detect substantially all secondary electrons. Although signal electron detector 712 is shown as being located immediately upstream of primary electron beam deflector 711, it is appreciated that in some embodiments it may be located immediately downstream of primary electron beam deflector 711 as well.

Figure 7B:
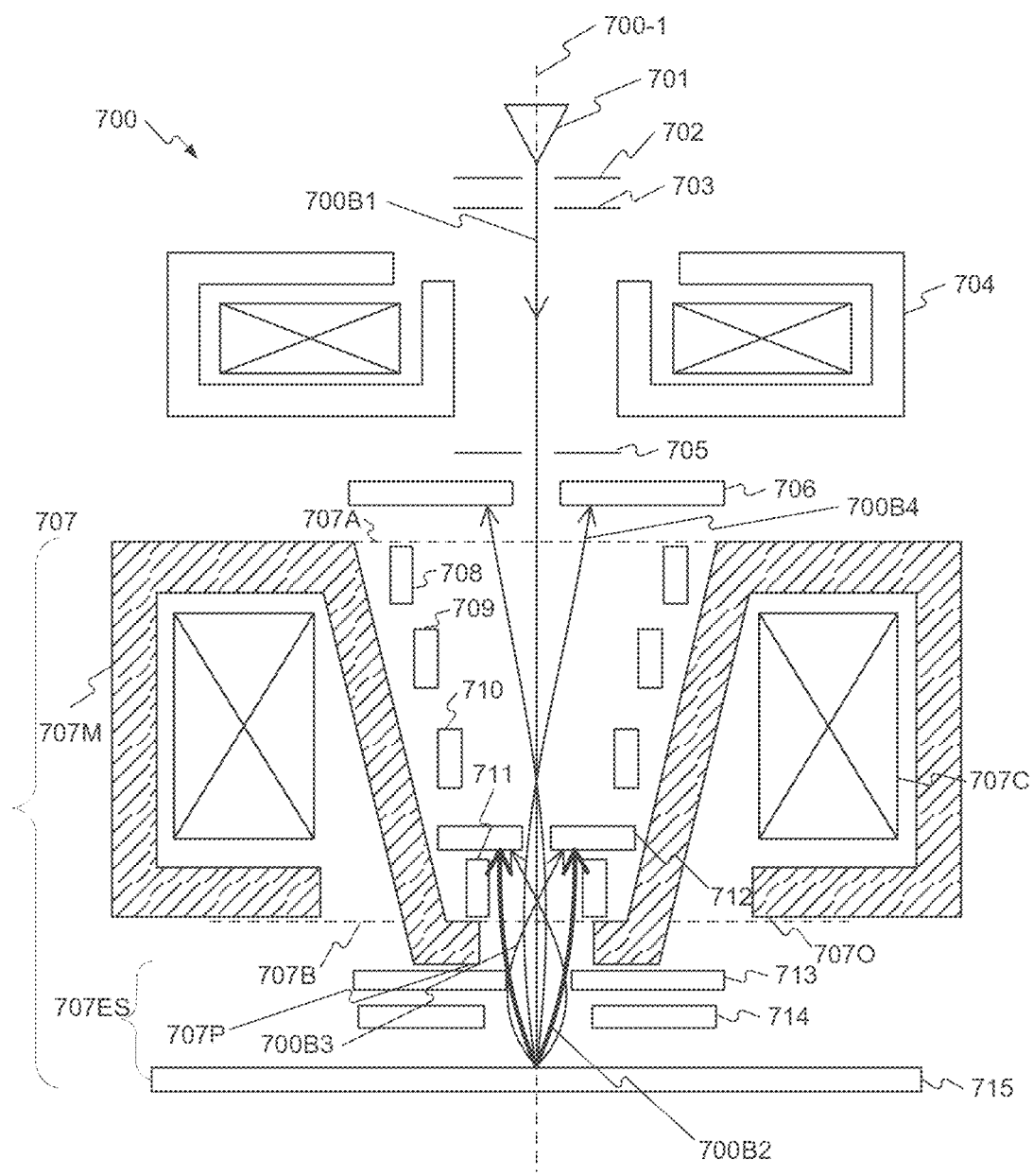

In some embodiments, a second voltage signal, different from the first voltage signal, may be applied to control electrode 714 to change the trajectory of signal electron beam 700B2 such that a substantial portion of signal electrons in signal electron beam 700B2 may be detected by signal electron detector 712, as shown in FIG. 7B. In some embodiments, changing the voltage applied to control electrode 714 may change the trajectory of signal electron beam 700B2, 700B3, or 700B4. Adjusting the trajectory of one or more signal electron beams 700B2, 700B3, or 700B4 may adjust the signal detection distribution across signal electron detectors 706, 712, and 713. For example, in the arrangement of apparatus 700 illustrated in FIG. 7A, the applied voltage signal to control electrode 714 may cause the detection of signal electrons to be distributed across three signal electron detectors 706, 712, and 713. In comparison, as illustrated in FIG. 7B, changing the applied voltage signal to control electrode 714 may change the trajectory of signal electron beam 700B2 to be detected by signal electron detector 712, causing an uneven distribution of signal electron detection across three signal electron detectors 706, 712, and 713. It is appreciated that controller 50 may dynamically adjust the voltage signal applied to control electrode 714 to adjust the signal electron detection distribution, as appropriate.

Figure 8A:
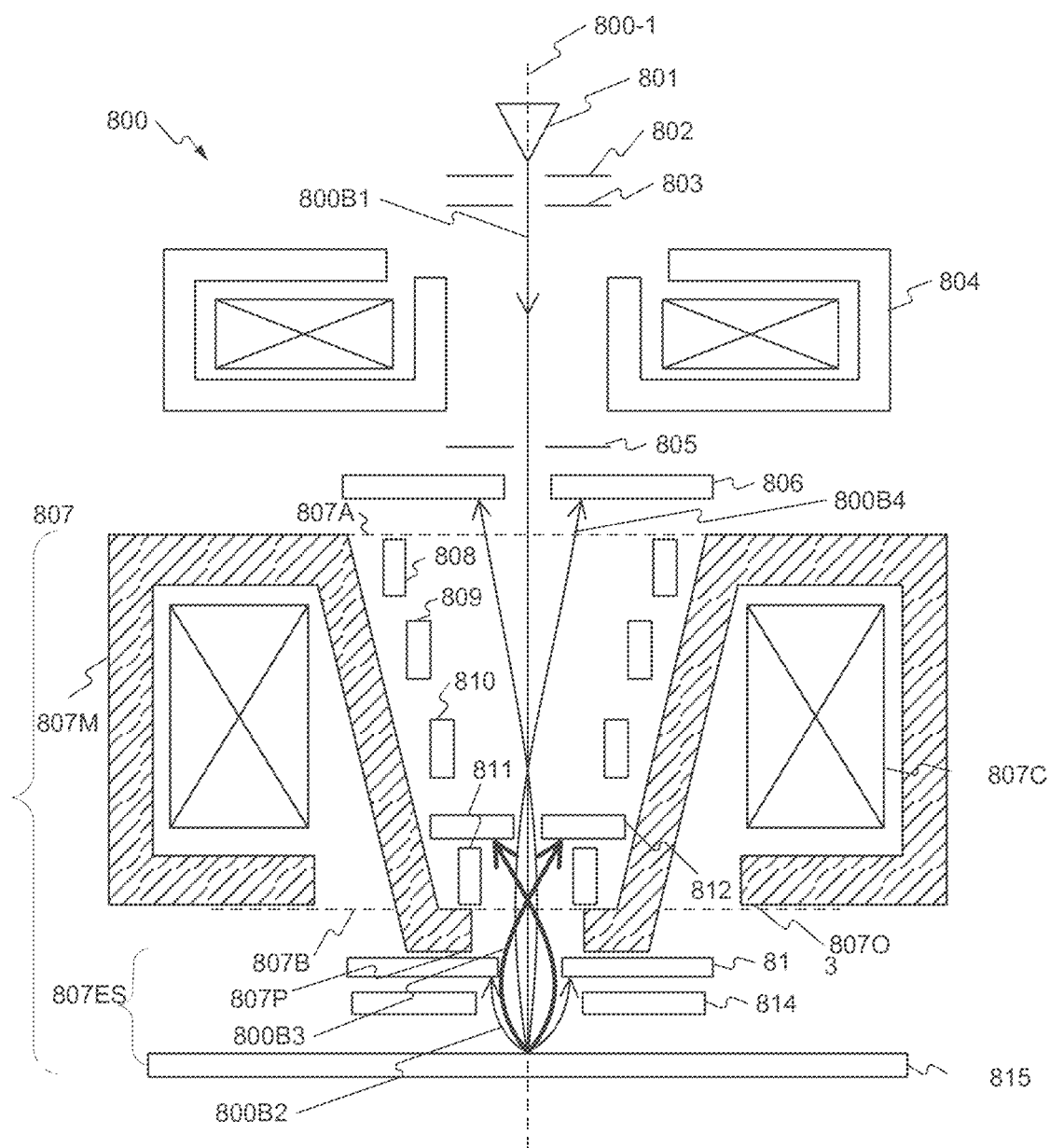
FIGS. 8A and 8B are schematic diagrams of an exemplary charged-particle beam apparatus illustrating the influence of adjustment of the voltage applied to a control electrode on the angular distribution of signal electrons, consistent with embodiments of the present disclosure.
Figure 8B:
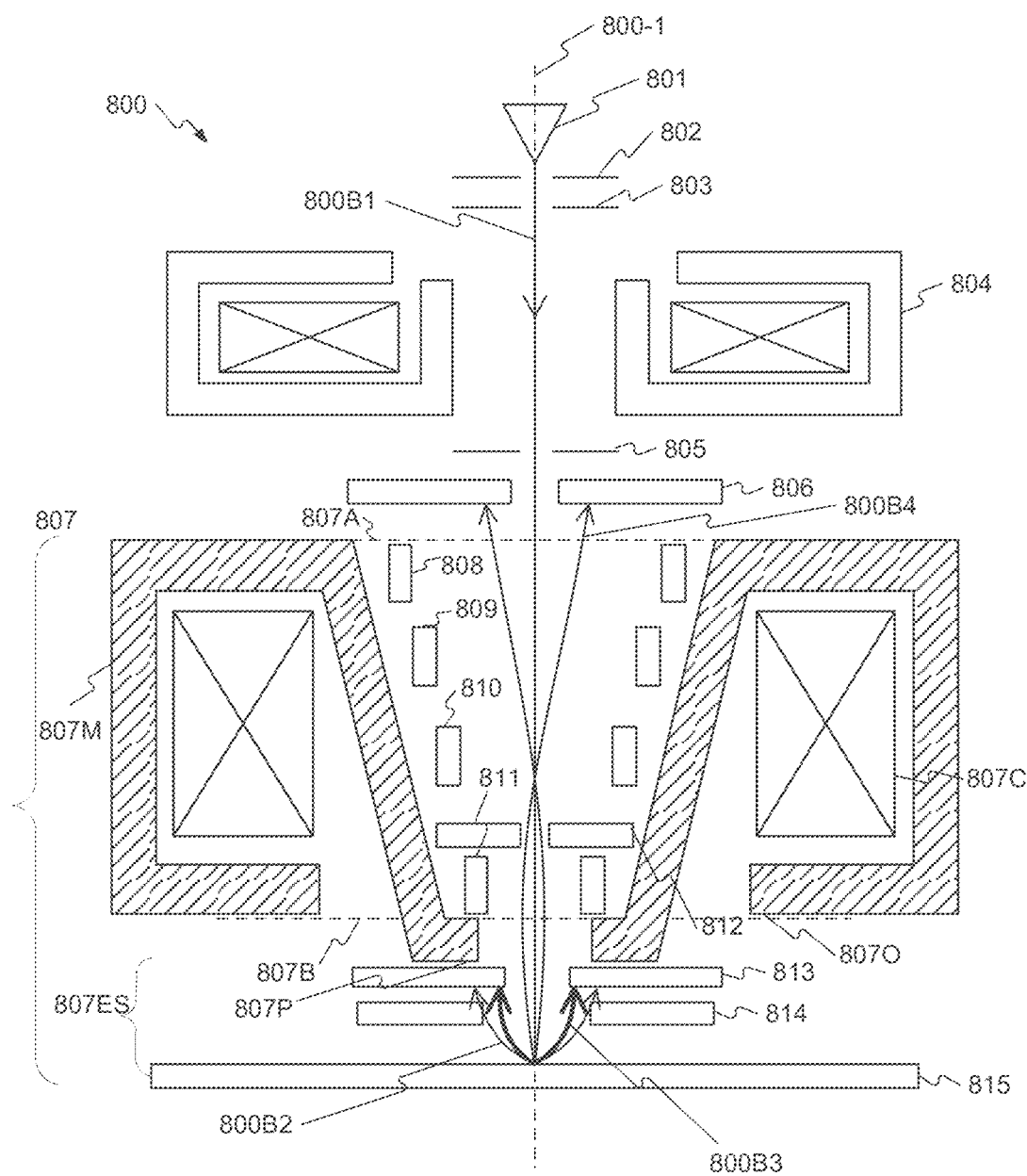

Reference is now made to FIGS. 8A and 8B, which illustrate schematic diagrams of exemplary charged-particle beam apparatus 800 (also referred to as apparatus 800), consistent with embodiments of the present disclosure. Apparatus 800 may comprise signal electron detectors 806, 812, and 813, and control electrode 814 located immediately upstream of sample 815. Although signal electron detector 812 is shown as being located immediately upstream of primary electron beam deflector 811, it is appreciated that in some embodiments it may be located immediately downstream of primary electron beam deflector 811 as well. In some embodiments, signal electron detectors 812 and 813 may both be located within the cavity of magnetic lens 807M.

In FIG. 8A, a first voltage signal may be applied to control electrode 814 to cause signal electrons (e.g., secondary or backscattered electrons) having low emission angles or low emission energy to form signal electron beam 800B4, signal electrons having medium emission angles and higher emission energy to form signal electron beam 800B3, and signal electrons having large emission angles and high emission energy to form signal electron beam 800B2. In some embodiments, a second voltage signal, different from the first voltage signal, may be applied to control electrode 814 to change the trajectory of signal electron beam 800B3 such that a substantial portion of signal electrons in signal electron beam 800B3 may be detected by signal electron detector 813, as shown in FIG. 8B.

In some embodiments, changing the voltage applied to control electrode 814 may change the trajectory of signal electron beam 800B2, 800B3, or 800B4. Adjusting the trajectory of one or more signal electron beams 800B2, 800B3, or 800B4 may adjust the signal detection distribution across signal electron detectors 806, 812, and 813. For example, in the arrangement of apparatus 800 illustrated in FIG. 8A, the applied voltage signal to control electrode 814 may cause the detection of signal electrons to be distributed across three signal electron detectors 806, 812, and 813. In comparison, as illustrated in FIG. 8B, changing the applied voltage signal to control electrode 814 may change the trajectory of signal electron beam 800B3 to be detected by signal electron detector 813, causing an uneven distribution of signal electron detection across three signal electron detectors 806, 812, and 813. It is appreciated that controller 50 may dynamically adjust the voltage signal applied to control electrode 814 to adjust the signal electron detection distribution, as appropriate.

Figure 9A:
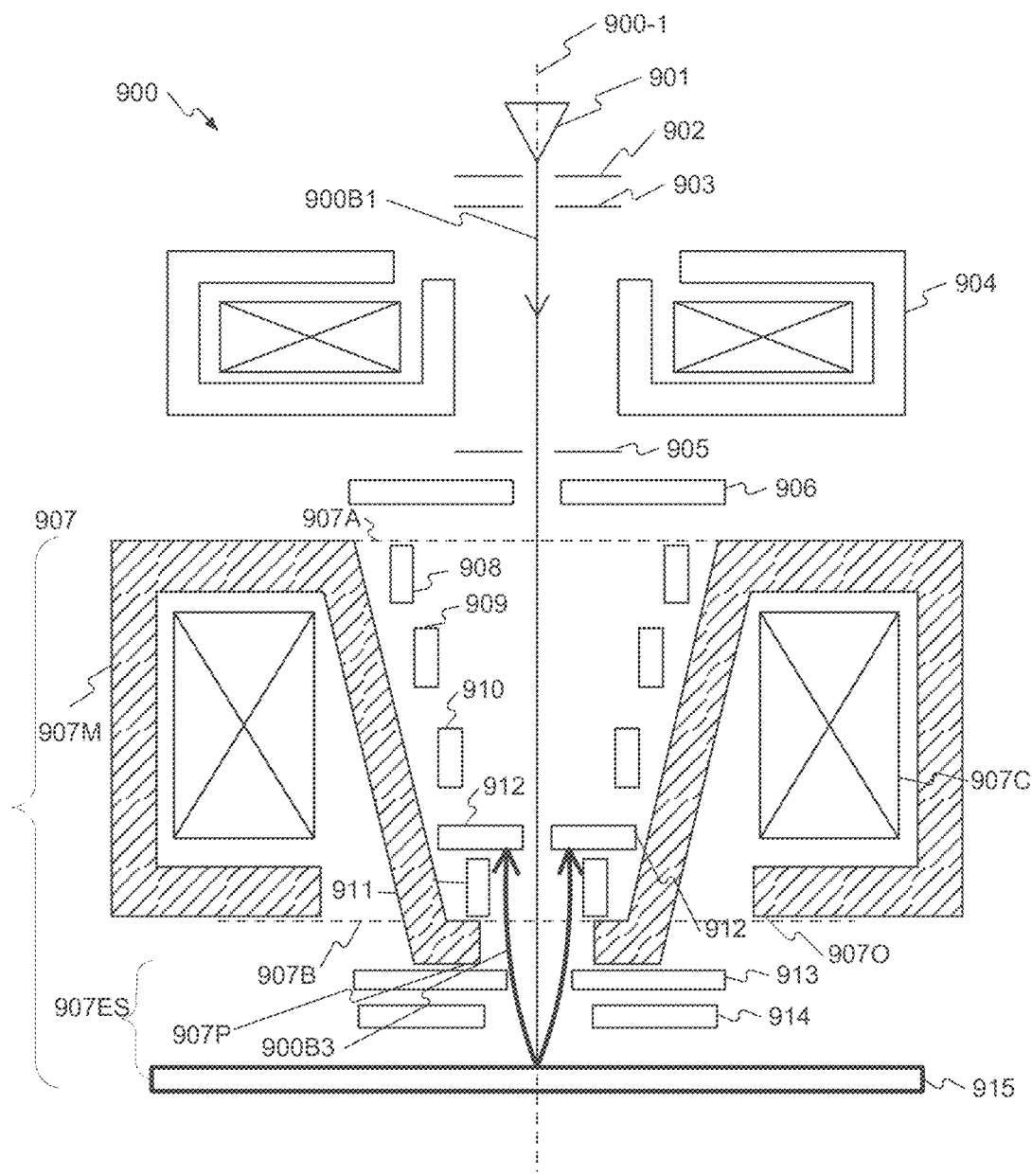
FIGS. 9A and 9B are schematic diagrams of an exemplary charged-particle beam apparatus illustrating the influence of adjusting sample position on the angular distribution of signal electrons, consistent with embodiments of the present disclosure.
Figure 9B:
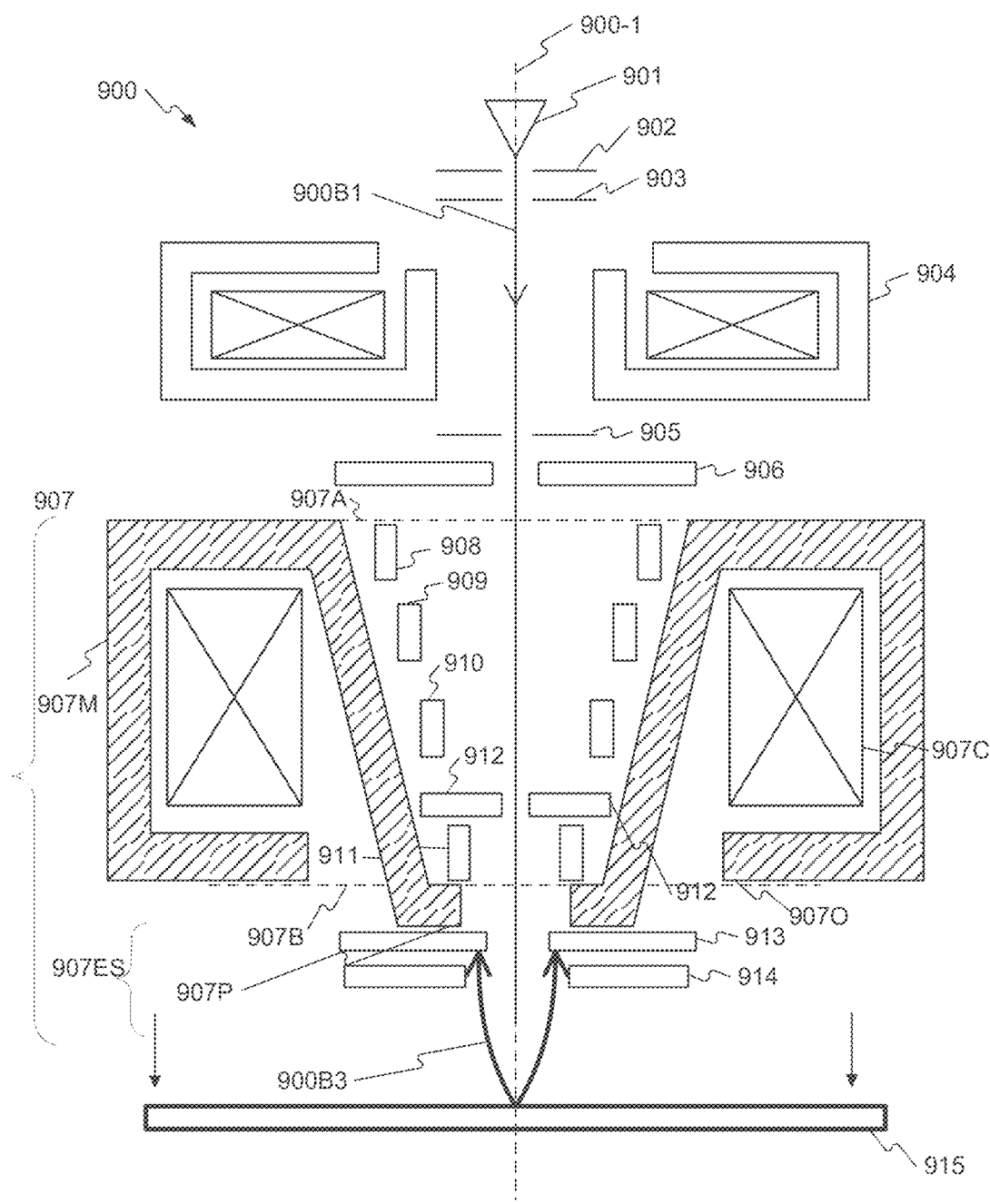

Reference is now made to FIGS. 9A and 9B, which illustrate schematic diagrams of exemplary charged-particle beam apparatus 900 (also referred to as apparatus 900), consistent with embodiments of the present disclosure. In comparison to apparatus 700 and 800, position of sample 915 of apparatus 900 may be adjustable. The position of sample 915 may be adjusted relative to other components including, control electrode 914, signal electron detector 912, polepiece 907P, magnetic lens 907M, among other things, along primary optical axis 900-1. Sample 915 may be disposed on a plane substantially perpendicular to primary optical axis 900-1.

FIG. 9A illustrates a first position of the plane along which sample 915 is disposed, defining a first distance between sample 915 and polepiece 907P or signal electron detector 912. Also illustrated, is exemplary signal electron beam 900B3 incident on signal electron detector 912 based on the emission polar angle and emission energy of the signal electrons emitted from sample 915 upon interaction between primary electron beam 900B1 and a portion of a surface of sample 915. Although not shown, it is appreciated that other signal electron beams such as, for example, secondary electron beam and large emission angle backscattered electron beam may be emitted from sample 915 as well.

In some embodiments, the position of the plane along which sample 915 is disposed may be adjusted dynamically, for example, based on a feedback associated with detection efficiency, detection distribution, imaging resolution, desired analysis, among other things. In some embodiments, sample 915 may be disposed on a sample stage (not shown) or on a sample holder (not shown). In such a configuration, the position of the sample stage or the sample holder may be adjusted so that the position of sample 915 may be adjusted. Although not shown, it is appreciated that the position of sample 915 or the sample stage/holder may be adjusted using electromechanical means including, but are not limited to, piezoelectric motor, actuators, micromanipulators, etc. Other micro-movement mechanisms may also be used.

FIG. 9B illustrates a second position of the plane along which sample 915 is disposed, defining a second distance between sample 915 and polepiece 907P or signal electron detector 912. The second distance may be larger than the first distance such that sample 915 is farther away from polepiece 907P or signal electron detector 912 along primary optical axis 900-1. The increase in vertical distance between sample 915 may cause a change in the trajectory of signal electron beam 900B3 such that a substantial portion of signal electron beam 900B3 may be detected by signal electron detector 913, thus changing the signal detection distribution across signal electron detectors 906, 912, and 913, while keeping the landing energy or the probe current unchanged.

In some embodiments, lowering the position of plane along which sample 915 is disposed may result in a reduction of the required objective lens excitation. In some embodiments, the required objective lens excitation for high landing energies (e.g., ~50 keV) may be reduced. In some embodiments, because the distance between sample 915 and signal electron detector 913 is increased by lowering sample 915 along primary optical axis, the occurrence of arcing and electrical damage to signal electron detector 913 may be reduced as well. Although FIGS. 9A and 9B show apparatus 900 comprising three signal electron detectors 906, 912, and 913, it is appreciated that the position of the sample may be adjusted to adjust the signal detection distribution in other configurations of charged-particle beam apparatus comprising any number of signal electron detectors.

Landing energy of primary electrons may be determined, for example, based on a difference between the source voltage and the sample voltage, among other things. For example, if the source is operated at −10 kV and the sample is applied −5 kV, the landing energy of primary electrons may be 5 keV. Typically, in a SEM, the landing energy may range from 0.2 keV to 50 keV, based on the application, material being studied, tool condition, among other factors, Some of the ways to change landing energy of the primary electrons of a primary electron beam may include adjusting the potential difference between cathode and extractor, adjusting the sample potential, or adjusting both simultaneously, among other techniques. Such voltage configurations and techniques, while being common, may negatively affect the stability of electron source, cause electrical damage to system components exposed to large electric fields, or negatively impact the overall imaging resolution and detector efficiency, among other issues. Therefore, it may be desirable to provide a voltage configuration for a charged-particle beam apparatus that preserves the source stability as well as minimizes the occurrence of electrical damage, while maintaining the range of landing energy from 0.2 keV to 50 keV.

Figure 10:
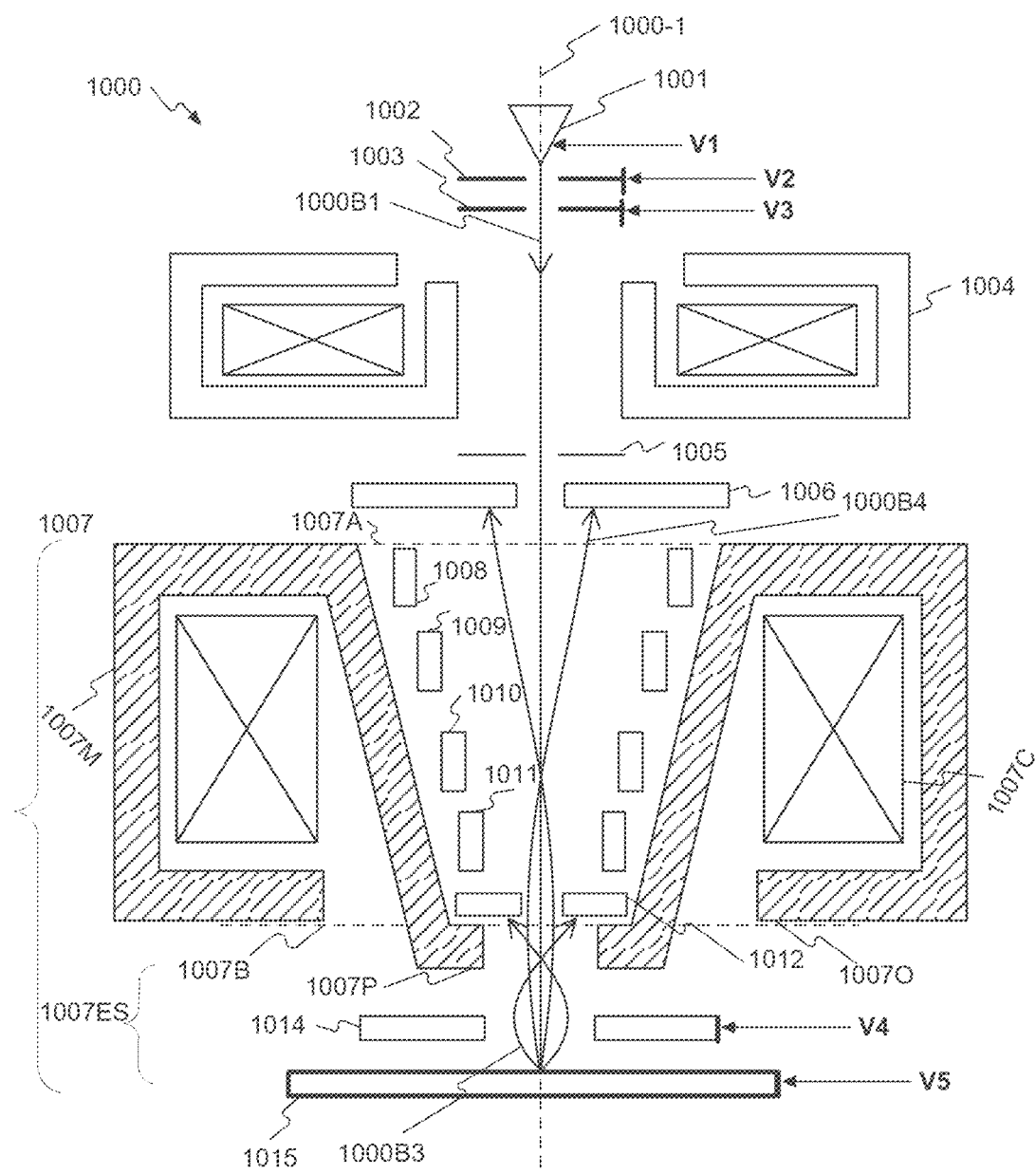
FIG. 10 is a schematic diagram of an exemplary charged-particle beam apparatus illustrating an exemplary voltage configuration, consistent with embodiments of the present disclosure.

Reference is now made to FIG. 10, which illustrates a schematic diagram of an exemplary charged-particle beam apparatus 1000 (also referred to as apparatus 1000) comprising an exemplary voltage configuration, consistent with embodiments of the present disclosure. Elements of apparatus 1000 (analogous to apparatus 300, for example) may be substantially similar to or may perform substantially similar functions as corresponding elements of apparatus 300. For example, electron source 1001, condenser lens 1004, beam-limiting aperture array 1005, signal electron detectors 1006, 1012, compound objective lens 1007, control electrode 1014 may be substantially similar to or may perform similar functions as electron source 301, condenser lens 304, beam-limiting aperture array 305, signal electron detectors 306, 312, compound objective lens 307, and control electrode 314 of apparatus 300. It is appreciated that components may be added, deleted, or modified, as appropriate.

In some embodiments, controller 50 may be configured to apply voltage V1 to electron source 1001, voltage V2 to extractor electrode 1002, voltage V3 to anode 1003, voltage V4 to control electrode 1014, or voltage V5 to sample 1015.

Controller 50 may further be configured to adjust one or more applied voltages V1-V5. Electron source 1001 may be, for example, a cold-cathode field emission source, a thermionic field emission filament, etc., and may generate primary electrons of primary electron beam 1000B1 which are extracted or accelerated by extractor electrode 1002 based on the applied voltage difference between V1 and V2. Anode 1003 may be configured to direct the generated primary electron beam downstream along primary optical axis 1000-1. Control electrode 1014 may be configured to adjust the electrostatic field near sample 1015. Landing energy of primary electron beam 1000B1 on sample 1015 may be based on the difference between the applied voltages V1 and V5, among other factors.

In some embodiments, apparatus 1000 may comprise electrode source 1001 configured to generate a plurality of primary electrons after being applied voltage V1, extractor electrode 1002 configured to extract the generated plurality of primary electrons after being applied voltage V2, wherein voltages V1 and V2 may be adjusted to discrete values corresponding to a range of landing energies of the plurality of primary electrons on sample 1015, while keeping the difference between V1 and V2 fixed to maintain a substantially stable or a stable extraction field on the cathode tip surface. As used herein, "discrete" values of applied voltages refer to substantially fixed or fixed values of applied voltages. In some embodiments, voltage V5 applied to sample 1015 may be adjusted based on the discrete values of voltages V1 and V2. As an example, if the desired landing energy is in a range 0.2 keV-7 keV, voltages V1 and V2 may be fixed at discrete values of −10 kV and 0 kV, respectively, while voltage V5 may be adjusted from −9.8 kV to −3 kV. As another example, if the desired landing energy is in a range 7 KeV-17 keV, voltages V1 and V2 may be fixed at discrete values of −20 kV and −10 kV, respectively, while voltage V5 may be adjusted from −13 kV to −3 kV. As another example, if the desired landing energy is in a range 17 keV-27 keV, voltages V1 and V2 may be fixed at discrete values of −30 kV and −20 kV, respectively, while voltage V5 may be adjusted from −13 kV to −3 kV. As another example, if the desired landing energy is in a range 27 keV-37 keV, voltages V1 and V2 may be fixed at discrete values of −40 kV and −30 kV, respectively, while voltage V5 may be adjusted from −13 kV to −3 kV. As another example, if the desired landing energy is in a range 37 keV-47 keV, voltages V1 and V2 may be fixed at discrete values of −50 kV and −40 kV, respectively, while voltage V5 may be adjusted from −13 kV to −3 kV.

It is appreciated that the voltages and ranges of voltages are exemplary, and other values of voltages, discrete values of voltages, and ranges of voltages may be used as well. In some embodiments, anode 1003 may be electrically grounded or voltage V3 applied to anode 1003 may be a reference voltage. In some embodiments, voltage V4 may be applied to control electrode 1014 to change the electrostatic or electric field near sample 1015. An exemplary range of voltage difference between V4 and V5 may be from −5 kV to +5 kV. The value of absolute voltage range for V5 and V4 can be larger, for example −30 kV to 0 kV, when the distance between stage and objective lens distance is larger. The change in electrostatic or electric field near sample 1015 may influence trajectories of the emitted signal electrons or signal electron beams such as signal electron beams 1000B3 or 1000B4.

Some of the advantages of the exemplary voltage configuration for apparatus 1000, as discussed in this disclosure, may include, but are not limited to, stability of emission sources, extended operating life of emission sources, stable emission of electrons, reduced electrical damage to sample and system elements exposed to the electrostatic field generated as a result of the potential differences, among other things.

In some embodiments, the difference between applied voltages V1 and V2 may remain substantially stable or stable. In the context of this disclosure, "substantially stable" values refer to values that are significantly similar or within statistical or measurement error. For example, if the values are within 1%-2%, they may be substantially stable. As an example, if the absolute value of the difference between applied voltages V1 and V2 for a first range of landing energies is 9.95 kV, and the absolute value of the difference between applied voltages V1 and V2 for a second range of landing energies is 10.05 kV, the difference between applied voltages V1 and V2 may be substantially stable. Adjusting the applied voltages V1 and V2 simultaneously to discrete values such as, for example, −10 kV and 0 kV, −20 kV and −10 kV, −30 kV and −20 kV, respectively, may expose electron source 1001 to substantially stable electric field for a large range of landing energies. The electric field near electron source 1001 may be substantially stable as the landing energy changes because the absolute value of the difference between voltages V1 and V2, and the distance between electron source 1001 and extractor electrode 1002 are fixed. Further, as discussed, the voltage V5 applied to sample 1015 may range from −13 kV to 0 kV for a large range of landing energies from 0.2 keV to 50 KeV. The absolute value of the range of voltage V5 is approximately 13 kV, and resultantly, the electric field near the sample, determined by the voltage difference between sample 1015, control electrode 1014, and polepiece 1007P, may not be very large. In some embodiments, the absolute value of the range of voltage V5 is no larger than 13 kV. Smaller values of electric field near sample 1015 may reduce the occurrence of electrical damage such as, arcing between control electrode 1014 and polepiece 1007P.

It is appreciated that the voltage configuration of apparatus 1000 may be applicable to one or more apparatuses described in this disclosure, such as apparatus 300, apparatus 400, apparatus 500, apparatus 600, apparatus 700, apparatus 800, or apparatus 900.

Reference is now made to FIGS. 11A-11D, which illustrate schematic diagrams of charged-particle detectors configured to detect signal electrons, consistent with embodiments of the present disclosure. Signal electron detectors 1100, 1110, 1120 and 1130 may comprise an opening 1104 configured to allow the primary electron beam (e.g., primary electron beam 300B1 of FIG. 3) to pass through, far example. Signal electron detectors 1100, 1110, 1120 or 1130 may comprise a diode, a scintillator, a radiation detector, a solid-state detector, a p-i-n junction diode, or a p-i-n detector, among other charged-particle sensing devices.

In some embodiments, signal electron detectors 1100-1130 may be configured to detect a portion of signal electrons based on characteristics of the signal electrons and based on the application. The characteristics may include, but are not limited to, emission energy, emission polar angle, emission azimuth angle, among other characteristics.

Figure 11A:
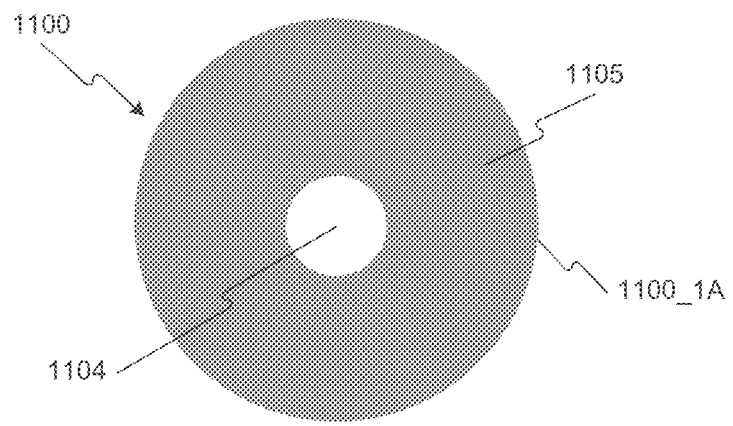
FIGS. 11A-11D are schematic diagrams of exemplary configurations of a charged-particle detector of an exemplary charged-particle beam apparatus 300 of FIG. 3, consistent with embodiments of the present disclosure.

In some embodiments, signal electron detectors may comprise a monolithic electron detector (e.g., detector 1100), or a segmented electron detector (e.g., detector 1110). In a monolithic electron detector, as shown in FIG. 11A, electron detection surface 1105 may comprise a continuous layer of charged-particle sensitive material, forming a single segment 1100_1A. Signal electron detector 1100 may be placed in the charged-particle beam apparatus (e.g., apparatus 300 of FIG. 3) such that the central axis of opening 1104 may align with a primary optical axis (e.g., primary optical axis 300-1 of FIG. 3).

Figure 11B:
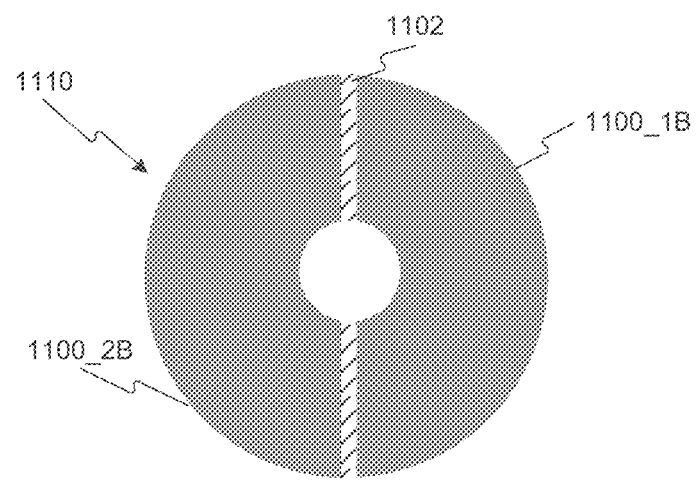
Figure 11C:
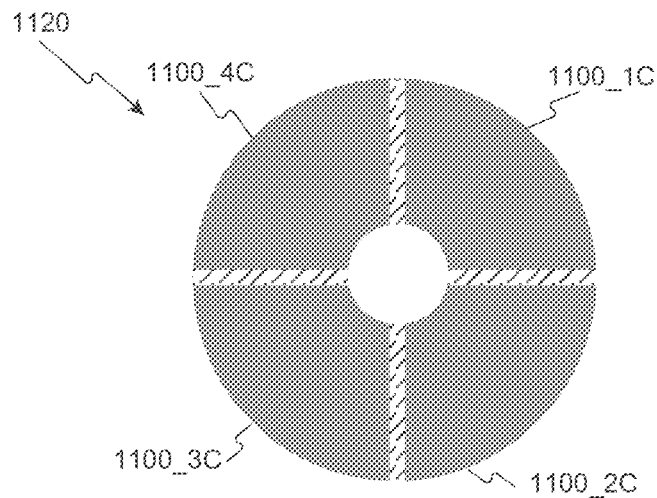
Figure 11D:
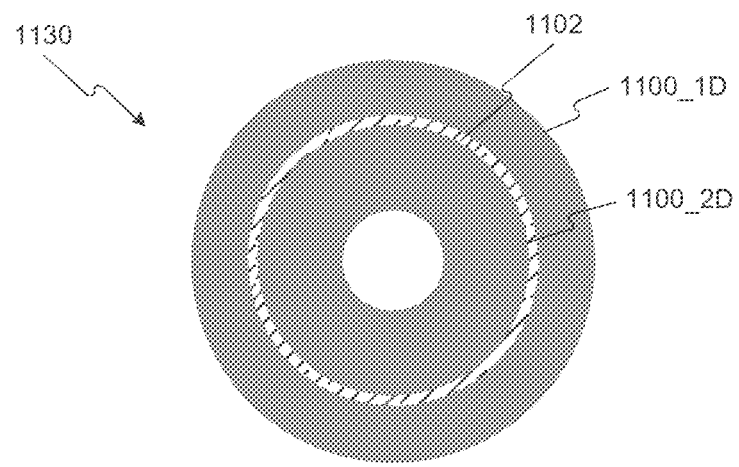

In a segmented electron detector, as shown in FIG. 11B, electron detection surface 1105 may comprise a discontinuous layer of charged-particle sensitive material, separated by material of substrate 1102, forming segments 1100_1B and 1100_2B. In some embodiments, segmented electron detectors 1110, 1120, and 1130 such as shown in FIGS. 11B-11D, respectively, may be cylindrical with a circular, elliptical, or polygonal cross-section. In some embodiments, one or more segments of segmented electron detectors may be arranged radially, circumferentially, or azimuthally along a primary optical axis (e.g., primary optical axis 300-1 of FIG. 3A) in a 2D arrangement. The charged-particle sensitive material may be sensitive to charged particles such as ionizing radiation, electrons, X-rays, photons, among other charged particles.

In some embodiments, segmented electron detectors may comprise two or more segments. For example, segmented electron detector 1120 of FIG. 11C may comprise four segments 1100_1C, 1100_2C, 1100_3C, and 1100_4C, arranged circumferentially around a central opening. In some embodiments, segmented electron detector 1130 of FIG. 11D may comprise two segments 1100_1D and 1100_2D arranged radially around the central opening, the two segments separated by material of substrate 1102 from which signal electron detector 1130 is made. It is appreciated that segmented electron detectors 1110, 1120, or 1130 may comprise two or more segments arranged in any configuration and disposed in the charged-particle beam apparatus such that electron detection surface 1105 may be exposed to incident signal electrons generated from sample (e.g., sample 315 of FIG. 3).

Some embodiments discussed in this disclosure may have some of all of the advantages discussed herein, among others.

i. Minimized or reduced electrical damage—Existing methods of improving backscattered electron detection efficiency may include positioning backscattered electron detectors near the sample and within the electrostatic field which may cause electrical damage to the detectors, for example, by arcing. The signal electron detectors located within the cavity of magnetic lens may be shielded from the electrostatic field, thus preventing, minimizing, or reducing arcing and electrical damage to electron detectors. Further, because the electron detectors are shielded by the polepiece, the working distance may be reduced to improve imaging resolution.

ii. Elimination of errors from detector misalignment— Some existing systems may adjust the position of electron detectors relative to the sample to maximize detection efficiency of backscattered electrons. However, in the presence of electric field, moving the electron detector position may introduce alignment errors, thereby negatively affecting the detection efficiency, imaging resolution, or collection efficiency. As proposed, the backscattered electron detectors are not adjustable or movable, thus minimizing alignment-related errors.

iii. High resolution of SE imaging and BSE detection efficiency—Existing techniques and systems can generally either improve SE detection efficiency or BSE detection efficiency, but not both simultaneously. Adding one or more backscattered electron detectors inside a cavity of the magnetic lens may allow the user to reduce the working distance to improve SE imaging resolution while capturing substantially all backscattered electrons to enhance BSE detection efficiency and minimizing electrical damage to the electron detectors.

iv. Large field-of-view (FOV) and high resolution—In some embodiments, a BSE detector may be located within the cavity of the magnetic lens and immediately upstream of a beam deflector. Such an arrangement may result in a larger FOV due to the beam deflector being between the detector and the sample, and may also result in high imaging resolution because the deflection field is closer to the magnetic field produced by the objective lens so that it may reduce deflection aberrations while increasing the FOV.

v. Variable emission angular distribution—The angular distribution of emitted signal electrons may be adjusted by, for example, adjusting the control electrode potential, adjusting the sample position, or adjusting the size of the opening of the electron detectors during design and manufacturing. The change in angular distribution may change the detection distribution of the electron detectors, as appropriately needed. This may provide flexibility in system design, spatial arrangement of detectors within the SEM column, and may minimize the electrical damage to electron detectors.

vi. High quality images and better defect detection to enable overlay metrology and inspection applications—Various combinations of high-resolution SE and BSE images may be produced simultaneously, which may result in capturing more information about defects and improved detection of defects. The collected high quality images may enable overlay related metrology and inspection applications.

vii. Stabilized emission and extended life of emission sources—To adjust the landing energy of primary electrons, existing systems may adjust the source potential, or adjust the sample potential, or adjust both simultaneously. Such voltage configurations and techniques, while being common, may negatively affect the stability of the electron source, cause electrical damage to system components exposed to large electric fields, or negatively impact the overall imaging resolution and detector efficiency. By simultaneously adjusting the applied voltage to electron source and extractor electrode to discrete values, the source may be exposed to a substantially stable electric field for a range of landing energy, resulting in stable emission of electrons from electron source and also extending the life of emission sources.

Figure 12:
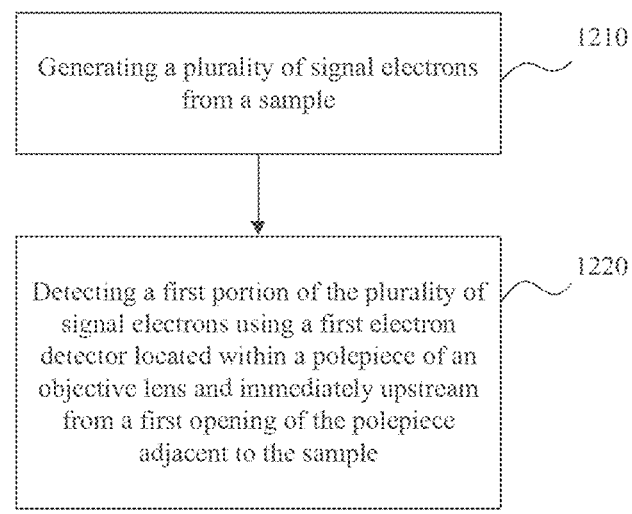
FIG. 12 is a process flowchart representing an exemplary method of observing a sample using charged-particle beam apparatus of FIG. 3, consistent with embodiments of the present disclosure.

Reference is now made to FIG. 12, which illustrates a process flowchart representing an exemplary method 1200 of observing a sample using charged-particle beam apparatus of FIG. 3, consistent with embodiments of the present disclosure. Method 1200 may be performed by controller 50 of EBI system 100, as shown in FIG. 1, for example. Controller 50 may be programmed to perform one or both steps of method 1200, and additional functions such as, activating a charged-particle source.

In step 1210, a plurality of signal electrons may be generated from a sample after interaction with a primary electron beam. A charged particle source (e.g., electron source 301 of FIG. 3) may be activated to generate a charged particle beam (e.g., primary electron beam 300B1 of FIG. 3). The electron source may be activated by a controller (e.g., controller 50 of FIG. 1). For example, the electron source may be controlled to emit primary electrons to form an electron beam along a primary optical axis (e.g., primary optical axis 300-1 of FIG. 3). The electron source may be activated remotely, for example, by using software, an application, or a set of instructions for a processor of a controller to power the electron source through a control circuitry.

The primary electron beam may be focused on the sample using a compound objective lens (e.g., compound objective lens 307 of FIG. 3). In some embodiments, a scanning deflection unit comprising primary electron beam deflectors (e.g., primary electron beam deflectors 308-311 of FIG. 3) may be configured to dynamically deflect the primary electron beam on surface of a sample (e.g., sample 315 of FIG. 3). The dynamic deflection of primary electron beam may cause a desired area or a desired region of interest to be scanned, for example in a raster scan pattern, to generate signal electrons including secondary and backscattered for sample inspection.

In step 1220, a first portion of signal electrons having high emission energies or medium emission polar angles may be collected and detected by a signal electron detector located within a polepiece of a magnetic lens (e.g., magnetic lens 307M of FIG. 3) and immediately upstream from an opening of the polepiece adjacent to the sample. Signal electron detector (e.g., signal electron detector 312 of FIG. 3) may be located immediately upstream from a polepiece (e.g., polepiece 307P of FIG. 3) and within the cavity of the magnetic lens. The signal electron detector may be placed between the primary electron beam deflector 311 and the polepiece. In some embodiments, the signal electron detector may be placed within the cavity of magnetic lens such that there are no primary electron beam deflectors between the signal electron detector and the sample.

In some embodiments, the polepiece may be electrically grounded or maintained at a reference voltage to minimize the influence of the retarding electrostatic field associated with the sample, on the signal electron detector, therefore minimizing the damage that may be caused to the detector. In a configuration such as shown in FIG. 3, the distance between the signal electron detector and the sample may be reduced so that the BSE detection efficiency and the imaging resolution may be enhanced while minimizing the occurrence of electrical failure or damage to signal electron detector. In some embodiments, signal electron detectors (e.g., signal electron detectors 306 and 312 of FIG. 3) may be configured to detect signal electrons having a wide range of emission polar angles and emission energies, respectively. For example, because of the proximity of a signal electron detector to the sample, it may be configured to collect backscattered electrons having a wide range of emission polar angles, and a second signal electron detector may be configured to collect or detect secondary electrons having low emission energies.

The location of the signal electron detector immediately upstream of the polepiece and within the cavity of the magnetic lens as shown in FIG. 3 may further enable easier assembly and alignment of the signal electron detector with other electro-optical components of the apparatus. Electrically grounded polepiece may substantially shield signal electron detector from the influence of retarding electrostatic field in the electrostatic lens (e.g., electrostatic lens 307ES of FIG. 3) formed by the polepiece, a control electrode (e.g., control electrode 314 of FIG. 3), and the sample.

Figure 13:
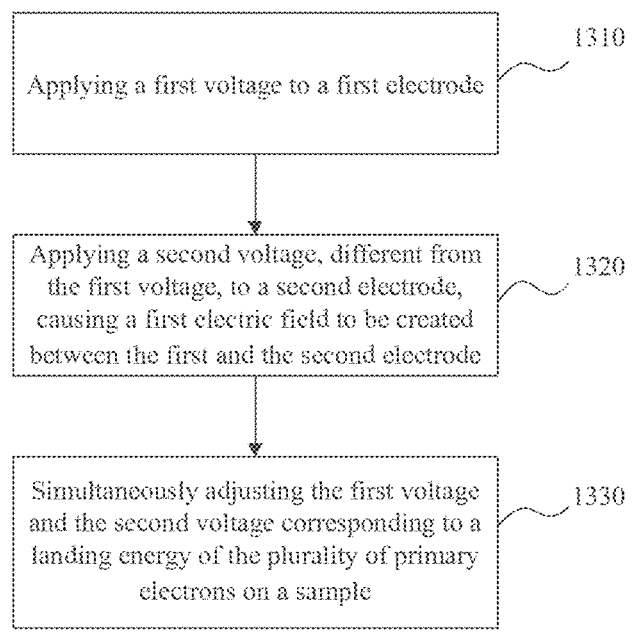
FIG. 13 is a process flowchart representing an exemplary method of configuring a charged-particle beam apparatus, consistent with embodiments of the present disclosure.

Reference is now made to FIG. 13, which illustrates a process flowchart representing an exemplary method 1300 of configuring a charged-particle beam apparatus such as apparatus 1000 of FIG. 10, consistent with embodiments of the present disclosure.

In step 1310, a first voltage or a voltage signal may be applied, using a controller, to a first electrode. The first electrode may comprise a cathode of an electron source configured to generate a plurality of primary electrons forming a primary electron beam. An electron source may be activated to generate a charged particle beam (e.g., primary electron beam 300B1 of FIG. 3). The electron source may be activated by a controller (e.g., controller 50 of FIG. 1). For example, the electron source may be controlled to emit primary electrons to form an electron beam along a primary optical axis (e.g., primary optical axis 300-1 of FIG. 3). The electron source may be activated remotely, for example, by using software, an application, or a set of instructions for a processor of a controller to power the electron source through a control circuitry.

In step 1320, a second voltage (e.g., voltage V2 of FIG. 10) may be applied, using the controller, to an electrode (e.g., extractor electrode 1002 of FIG. 10), the second voltage V2 being different in amplitude from the first voltage V1. The difference in the voltages V1 and V2 may be configured to create an electric field between the first and the second electrode to extract the generated plurality of primary electrons.

In step 1330, the first voltage and the second voltage may be simultaneously adjusted based on a landing energy of the plurality of primary electrons on a sample (e.g., sample 315 of FIG. 3). The first voltage V1 and the second voltage V2 may be adjusted to discrete values corresponding to a range of landing energies of the plurality of primary electrons on the sample. In some embodiments, voltage V5 applied to the sample may be adjusted based on the discrete values of voltages V1 and V2. As an example, if the desired landing energy is in a range 0.2 keV-7 keV, voltages V1 and V2 may be fixed at discrete values of −10 kV and 0 kV, respectively, while voltage V5 may be adjusted from −9.8 kV to −3 kV. As another example, if the desired landing energy is in a range 7 keV-17 keV, voltages V1 and V2 may be fixed at discrete values of −20 kV and −10 kV, respectively, while voltage V5 may be adjusted from −13 kV to −3 kV. As another example, if the desired landing energy is in a range 17 keV-7 keV, voltages V1 and V2 may be fixed at discrete values of −30 kV and −20 kV, respectively, while voltage V5 may be adjusted from −13 kV to −3 kV. As another example, if the desired landing energy is in a range 27 keV-37 keV, voltages V1 and V2 may be fixed at discrete values of −40 kV and −30 kV, respectively, while voltage V5 may be adjusted from −13 kV to −3 kV. As another example, if the desired landing energy is in a range 37 keV-47 keV, voltages V1 and V2 may be fixed at discrete values of −50 kV and −40 kV, respectively, while voltage V5 may be adjusted from −1.3 kV to −3 kV.

The difference between applied voltages V1 and V2 may remain substantially stable or stable. Adjusting the applied voltages V1 and V2 simultaneously to discrete values such as, for example, −10 kV and 0 kV, −20 kV and −10 kV, −30 kV and −20 kV, respectively, may expose the electron source to substantially stable electric field for a large range of landing energies. The electric field near the electron source may be substantially stable as the landing energy changes because the absolute value of the difference between voltages V1 and V2, and the distance between the electron source and extractor electrode (e.g., extractor electrode 1002 of FIG. 10) are stable. Further, as discussed, the voltage V5 applied to the sample may range from −13 kV to 0 kV for a large range of landing energies. The absolute value of the range of voltage V5 is approximately 13 kV, and resultantly, the electric field near the sample may not be very large. In some embodiments, the absolute value of the range of voltage V5 is no larger than 13 kV. Smaller values of electric field near the sample may reduce the occurrence of electrical damage such as, arcing between control electrode 1014 and polepiece 1007P.

The embodiments may further be described using the following clauses;

1. An electron beam apparatus comprising:
an electron source configured to generate a primary electron beam along a primary optical axis;
a compound objective lens comprising a magnetic lens and an electrostatic lens, the magnetic lens comprising a cavity configured to allow the primary electron beam to pass through; and
a first electron detector configured to detect a first portion of a plurality of signal electrons generated from a sample,
wherein the first electron detector is located immediately upstream from a polepiece of the magnetic lens with respect to a path of the primary electron beam along the primary optical axis and inside the cavity of the magnetic lens.

2. The apparatus of clause 1, wherein the first electron detector is positioned such that a central axis of an opening of the first electron detector is aligned with the primary optical axis.

3. The apparatus of clause 2, wherein the opening of the first electron detector is smaller than the first opening of the polepiece of the magnetic lens.

4. The apparatus of any one of clauses 1-3, further comprising a second electron detector configured to detect a second portion of the plurality of signal electrons, and disposed upstream from the first electron detector along the primary optical axis.

5. The apparatus of clause 4, wherein the opening of the first detector is configured to allow the second portion of the plurality of signal electrons to pass through.

6. The apparatus of any one of clauses 4 and 5, wherein the second electron detector comprises an opening configured to allow a portion of the primary electron beam to pass through.

7. The apparatus of clause 6, wherein the second electron detector comprises an in-lens detector positioned such that the opening of the second electron detector is aligned with the primary optical axis.

8. The apparatus of any one of clauses 4-7, further comprising a beam manipulator configured to deflect the primary electron beam onto a surface of the sample and located between the first and the second electron detector.

9. The apparatus of clause 8, wherein the beam manipulator comprises a plurality of beam deflectors aligned with the primary optical axis and located inside the cavity of the magnetic lens.

10. The apparatus of any one of clauses 1-9, further comprising a third electron detector configured to detect a third portion of the plurality of signal electrons, and disposed downstream from the first electron detector along the primary optical axis.

11. The apparatus of clause 10, wherein the third electron detector is disposed along the primary optical axis downstream from the first electron detector and immediately upstream from the polepiece of the magnetic lens.

12. The apparatus of any one of clauses 10 and 11, wherein the third electron detector is disposed along the primary optical axis between the polepiece of the magnetic lens and the sample.

13. The apparatus of any one of clauses 10-12, wherein a size of an opening of the third electron detector is determined based on a desired field-of-view and a distribution of the plurality of signal electrons.

14. The apparatus of any one of clauses 10-13, wherein the first, the second, and the third electron detectors are configured to detect a substantial portion of the plurality of signal electrons generated from the sample.

15. The apparatus of any one of clauses 10-14, wherein the first, the second, and the third electron detectors comprise a continuous detection surface or a segmented detection surface.

16. The apparatus of clause 15, wherein the segmented detection surface comprises a plurality of segments arranged radially or azimuthally around the primary optical axis 17. The apparatus of any one of clauses 1-16, further comprising a control electrode disposed between the sample and the first electron detector and configured to adjust a path of the plurality of signal electrons generated from the sample.

18. The apparatus of clause 17, wherein the control electrode comprises a plurality of electrodes disposed between the first electron detector and the sample.

19. The apparatus of any one of clauses 17 and 18, wherein the control electrode is configured to influence an electrostatic field near the sample based on an applied voltage signal 20. The apparatus of clause 19, wherein the polepiece of the magnetic lens is configured to substantially shield the first electron detector from the electrostatic field near the sample.

21. The apparatus of any one of clauses 19 and 20, wherein a change in the electrostatic field causes a change in a trajectory of the first portion of the plurality of signal electrons.

22. The apparatus of any one of clauses 19-21, wherein the applied voltage signal is configured to be adjustable to enable influencing an angular distribution of the plurality of signal electrons across a plurality of electron detectors that includes the first electron detector.

23. The apparatus of clause 22, wherein a position of a plane of the sample is adjustable along the primary optical axis to enable influencing the angular distribution of the plurality of signal electrons across the plurality of electron detectors, and an excitation of the compound objective lens, 24. The apparatus of any one of clauses 1-23, wherein the electrostatic lens is formed in presence of an electric field between the polepiece and the sample.

25. The apparatus of any one of clauses 1-24, wherein the plurality of signal electrons comprises secondary electrons, backscattered electrons, or auger electrons.

26. The apparatus of any one of clauses 1-25, wherein a vertical distance between the first electron detector and the sample is in a range of 6 mm to 80 mm.

27. An electron beam apparatus comprising:
an electron source configured to generate a primary electron beam along a primary optical axis;
a compound objective lens comprising a magnetic lens and an electrostatic lens, the magnetic lens comprising a cavity configured to allow the primary electron beam to pass through;
a first electron detector configured to detect a first portion of a plurality of signal electrons generated from a sample, wherein the first electron detector is located inside the cavity of the magnetic lens; and a beam manipulator configured to deflect the primary electron beam onto a surface of the sample, and located between the first electron detector and a polepiece of the magnetic lens.

28. The apparatus of clause 27, wherein the beam manipulator comprises a plurality of beam deflectors, and wherein a beam deflector of the plurality of beam deflectors is located inside the cavity of the magnetic lens.

29. The apparatus of any one of clauses 27 and 28, wherein the first electron detector is positioned such that a central axis of an opening of the first electron detector is aligned with the primary optical axis.

30. The apparatus of clause 29, wherein the opening of the first electron detector is smaller than the opening of the polepiece of the magnetic lens.

31. The apparatus of any one of clauses 29-30, further comprising a second electron detector configured to detect a second portion of the plurality of signal electrons, and disposed upstream from the first electron detector along the primary optical axis.

32. The apparatus of clause 31, wherein the opening of the first detector is configured to allow the second portion of the plurality of signal electrons to pass through.

33. The apparatus of any one of clauses 31 and 32, wherein the second electron detector comprises an opening configured to allow a portion of the primary electron beam to pass through.

34. The apparatus of clause 33, wherein the second electron detector comprises an in-lens detector positioned such that the opening of the second electron detector is aligned with the opening of the first electron detector.

35. The apparatus of any one of clauses 27-34, further comprising a third electron detector configured to detect a third portion of the plurality of signal electrons and disposed downstream from the first electron detector along the primary optical axis.

36. The apparatus of clause 35, wherein the third electron detector is disposed along the primary optical axis downstream from the first electron detector and immediately upstream from the polepiece of the magnetic lens.

37. The apparatus of any one of clauses 35 and 36, wherein the third electron detector is disposed along the primary optical axis between the polepiece of the magnetic lens and the sample.

38. The apparatus of any one of clauses 35-37, wherein a size of an opening of the third electron detector is determined based on a desired field-of-view and a distribution of the plurality of signal electrons.

39. The apparatus of any one of clauses 35-38, wherein the first, the second, and the third electron detectors are configured to detect a substantial portion of the plurality of signal electrons generated from the sample.

40. The apparatus of any one of clauses 35-39, wherein the first, the second, and the third electron detectors comprise a continuous detection surface or a segmented detection surface.

41. The apparatus of clause 40, wherein the segmented detection surface comprises a plurality of segments arranged radially or azimuthally around the primary optical axis.

42. The apparatus of any one of clauses 27-41, further comprising a control electrode disposed between the sample and the first electron detector, and configured to adjust a path of the plurality of signal electrons generated from the sample.

43. The apparatus of clause 42, wherein the control electrode comprises a plurality of electrodes disposed between the first electron detector and the sample.

44. The apparatus of any one of clauses 42 and 43, wherein the control electrode is configured to influence an electrostatic field near the sample based on an applied voltage signal.

45. The apparatus of clause 44, wherein the polepiece of the magnetic lens is configured to substantially shield the first electron detector from the electrostatic field near the sample.

46. The apparatus of any one of clauses 44 and 45, wherein a change in the electrostatic field causes a change in a trajectory of the first portion of the plurality of signal electrons.

47. The apparatus of any one of clauses 44-46, wherein the applied voltage signal is configured to be adjustable to enable influencing an angular distribution of the plurality of signal electrons across a plurality of electron detectors that includes the first electron detector.

48. The apparatus of clause 47, wherein a position of a plane of the sample is adjustable along the primary optical axis to enable influencing the angular distribution of the plurality of signal electrons across the plurality of electron detectors, and an excitation of the compound objective lens.

49. The apparatus of any one of clauses 27-48, wherein the electrostatic lens is formed in presence of an electric field between the polepiece and the sample.

50. The apparatus of any one of clauses 27-49, wherein the plurality of signal electrons comprises secondary electrons, backscattered electrons, or auger electrons.

51. The apparatus of any one of clauses 27-50, wherein a vertical distance between the first electron detector and the sample is in a range of 6 mm to 80 mm.

52. An electron beam apparatus comprising:
a first electrode configured to be applied a first voltage; and
a second electrode configured to be applied a second voltage different from the first voltage, a first electric field created between the first and the second electrode by a difference in the first and the second voltages, the first electric field configured to extract a plurality of primary electrons from the first electrode,
wherein the first voltage is adjusted to a first discrete value and the second voltage is simultaneously adjusted to a second discrete value different from the first discrete value, the first and the second discrete values corresponding to a range of landing energy of the plurality of primary electrons on a sample.

53. The apparatus of clause 52, wherein a difference between the first and the second discrete values of the first and the second voltage is substantially fixed for a plurality of ranges of landing energy.

54. The apparatus of clause 53, wherein an absolute value of the difference between the first and the second discrete values is in a range of 5 kV-15 kV.

55. The apparatus of any one of clauses 53 and 54, wherein the substantially fixed difference between the first and the second discrete values creates a substantially stable electric field between the first and the second electrodes.

56. The apparatus of any one of clauses 52-55, wherein a third voltage is applied to the sample, a value of the third voltage determined based on the first and the second voltages and the range of landing energy of the plurality of primary electrons.

57. The apparatus of any one of clauses 52-56, further comprising a first electron detector located immediately upstream from a polepiece of a magnetic lens and within a cavity of the magnetic lens.

58. The apparatus of clause 57, wherein the first electron detector is configured to detect a first portion of a plurality of signal electrons generated from the sample after interaction between the plurality of primary electrons and the sample.

59. The apparatus of any one of clauses 57 and 58, wherein the first electron detector is positioned such that a central axis of an opening of the first electron detector is aligned with a primary optical axis of a primary electron beam comprising the plurality of primary electrons.

60. The apparatus of clause 59, wherein the opening of the first electron detector is smaller than an opening of the polepiece of the magnetic lens.

61. The apparatus of any one of clauses 59 and 60, further comprising a second electron detector configured to detect a second portion of the plurality of signal electrons, and disposed upstream from the first electron detector along the primary optical axis.

62. The apparatus of clause 61, wherein the opening of the first electron detector is configured to allow the second portion of the plurality of signal electrons to pass through.

63. The apparatus of any one of clauses 61 and 62, wherein the second electron detector comprises an opening configured to allow a portion of the primary electron beam to pass through.

64. The apparatus of clause 61, wherein the second electron detector comprises an in-lens detector positioned such that the opening of the second electron detector is aligned with the opening of the first electron detector.

65. The apparatus of any one of clauses 59-64, further comprising a third electron detector configured to detect a third portion of the plurality of signal electrons, and disposed downstream from the first electron detector along the primary optical axis.

66. The apparatus of clause 65, wherein the third electron detector is disposed along the primary optical axis downstream from the first electron detector and immediately upstream from the polepiece of the magnetic lens.

67. The apparatus of any one of clauses 65 and 66, wherein the third electron detector is disposed between the polepiece of the magnetic lens and the sample.

68. The apparatus of any one of clauses 65-67, wherein a size of an opening of the third electron detector is determined based on a desired field-of-view and a distribution of the plurality of signal electrons.

69. The apparatus of any one of clauses 65-68, wherein the first, the second, and the third electron detectors are configured to detect a substantial portion of the plurality of signal electrons generated from the sample.

70. The apparatus of any one of clauses 65-69, wherein the first, the second, and the third electron detectors comprise a continuous detection surface or a segmented detection surface.

71. The apparatus of clause 70, wherein the segmented detection surface comprises a plurality of segments arranged radially or azimuthally around the primary optical axis.

72. The apparatus of any one of clauses 52-71, further comprising a beam manipulator configured to deflect the plurality of primary electrons onto a surface of the sample.

73. The apparatus of clause 72, wherein the beam manipulator comprises a plurality of beam deflectors aligned with the primary optical axis and located between the first and the second electron detector.

74. The apparatus of any one of clauses 72 and 73, further comprising a control electrode disposed between the sample and the beam manipulator.

75. The apparatus of clause 74, wherein the control electrode comprises a plurality of electrodes disposed upstream from the sample.

76. The apparatus of any one of clauses 74 and 75, wherein the control electrode is configured to adjust a path of the plurality of signal electrons generated from the sample.

77. The apparatus of any one of clauses 74-76, wherein the control electrode is further configured to influence an electrostatic field near the sample based on an applied voltage signal.

78. The apparatus of clause 77, wherein the polepiece of the objective lens is configured to substantially shield the first electron detector from the electrostatic field near the sample.

79. The apparatus of any one of clauses 77 and 78, wherein a change in the electrostatic field causes a change in a trajectory of the first portion of the plurality of signal electrons.

80. The apparatus of any one of clauses 77-79, wherein the applied voltage signal is configured to be adjustable to enable influencing an angular distribution of the plurality of signal electrons across a plurality of electron detectors that includes the first electron detector.

81. The apparatus of clause 80, wherein a position of a plane of the sample is adjustable along the primary optical axis to enable influencing the angular distribution of the plurality of signal electrons across the plurality of electron detectors.

82. The apparatus of any one of clauses 57-81, further comprising a compound objective lens, the compound objective lens comprising the magnetic lens and an electrostatic lens formed in presence of an electric field between the polepiece and the sample.

83. The apparatus of any one of clauses 57-82, wherein a vertical distance between the first electron detector and the sample is in a range of 6 mm to 80 mm.

84. A method performed by an electron beam apparatus for observing a sample, the method comprising:
focusing a primary electron beam onto the sample using a compound objective: lens comprising a magnetic lens and an electrostatic lens, the magnetic lens comprising a cavity that allows the primary electron beam to pass through;
generating a plurality of signal electrons from the sample after interaction with the primary electron beam; and
detecting a first portion of the plurality of signal electrons using a first electron detector located immediately upstream from a polepiece of the magnetic lens with respect to a path of the primary electron beam along a primary optical axis and inside the cavity of the magnetic lens.

85. The method of clause 84, further comprising detecting, using a second electron detector, a second portion of the plurality of signal electrons.

86. The method of any one of clauses 84-85, further comprising detecting the plurality of signal electrons based on a characteristic of a signal electron of the plurality of signal electrons.

87. The method of clause 86, wherein the characteristic of the signal electron comprises an emission energy, an emission polar angle, or an emission azimuth angle of the signal electron with reference to a primary optical axis.

88. The method of any one of clauses 85-87, further comprising detecting, using a third electron detector, a third portion of the plurality of signal electrons, the third electron detector located downstream of the first and the second electron detectors.

89. The method of clause 88, further comprising detecting, using the first, the second and the third electron detectors, substantially all signal electrons of the plurality of signal electrons generated from the sample.

90. The method of any one of clauses 84-89, further comprising influencing, using a control electrode, an electrostatic field near the sample by adjusting a voltage applied to the control electrode.

91. The method of clause 90, wherein adjusting the voltage applied to the control electrode causes a change in a signal electron detection distribution across the first, the second, and the third electron detectors.

92. The method of any one of clauses 90 and 91, wherein adjusting the voltage applied to the control electrode causes a change in a trajectory of the first portion of the plurality of signal electrons.

93. The method of any one of clauses 90-92, wherein adjusting the voltage applied to the control electrode influences an angular distribution of the plurality of signal electrons.

94. The method of any one of clauses 90-93, wherein adjusting the voltage applied to the control electrode comprises applying a first voltage signal configured to increase an emission polar angle of the plurality of signal electrons.

95. The method of any one of clauses 90-94, wherein adjusting the voltage applied to the control electrode comprises applying a second voltage signal configured to decrease an emission polar angle of the plurality of signal electrons.

96. The method of any one of clauses 93-95, further comprising adjusting a position of a plane of the sample to enable influencing the angular distribution of the plurality of signal electrons.

97. The method of clause 96, wherein adjusting the position of the plane of the sample comprises adjusting the position of the sample along the primary optical axis.

98. The method of any one of clauses 96 and 97, wherein adjusting the position of the plane of the sample comprises increasing or decreasing a vertical distance between the sample and the first electron detector.

99. A method of configuring a charged-particle beam apparatus for observing a sample, the method comprising:
applying a first voltage to a first electrode;
applying a second voltage, different from the first voltage, to a second electrode, causing a first electric field to be created between the first and the second electrode based on a difference in the first and the second voltages, the first electric field configured to extract a plurality of primary electrons from the first electrode; and
simultaneously adjusting the first voltage to a first discrete value and the second voltage to a second discrete value different from the first discrete value, the first and the second discrete values corresponding to a range of landing energy of the plurality of primary electrons on a sample.

100. The method of clause 99, wherein a difference between the first and the second discrete values is substantially fixed for a plurality of ranges of landing energy.

101. The method of clause 97, wherein an absolute value of the difference between the first and the second discrete values is in a range of 5 kV-15 kV.

102. The method of any one of clauses 100 and 101, wherein the substantially fixed difference between the first and the second discrete values creates a substantially stable electric field between the first and the second electrodes.

103. The method of any one of clauses 99-102, further comprising applying a third voltage to the sample, the third voltage determined based on the first and the second voltages and the range of landing energy of the plurality of primary electrons.

104. A non-transitory computer readable medium storing a set of instructions that is executable by one or more processors of an electron beam apparatus to cause the electron beam apparatus to perform a method of observing a sample, the method comprising:
focusing a primary electron beam onto the sample using a compound objective lens comprising a magnetic lens and an electrostatic lens, the magnetic lens comprising a cavity that allows the primary electron beam to pass through;
generating a plurality of signal electrons from the sample after interaction with the primary electron beam; and
detecting a first portion of the plurality of signal electrons using a first electron detector located immediately upstream from a polepiece of the magnetic lens with respect to a path of the primary electron beam along a primary optical axis and inside the cavity of the magnetic lens.

105. The non-transitory computer readable medium of clause 104, wherein the set of instructions that is executable by one or more processors of the electron beam apparatus causes the electron beam apparatus to further perform detecting, using a second electron detector, a second portion of the plurality of signal electrons.

106. The non-transitory computer readable medium of any one of clauses 104 and 105, wherein the set of instructions that is executable by one or more processors of the electron beam apparatus causes the electron beam apparatus to further perform influencing, using a control electrode, an electrostatic field near the sample by adjusting a voltage applied to the control electrode, wherein
adjusting the voltage applied to the control electrode causes a change in a trajectory of the first portion of the plurality of signal electrons.

107. The non-transitory computer readable medium of clause 106, wherein the set of instructions that is executable by one or more processors of the electron beam apparatus causes the electron beam apparatus to further perform adjusting a position of a plane of the sample along the primary optical axis, wherein adjusting the position of the plane of the sample causes a change in a signal electron detection distribution across the first and the second electron detectors.

108. A non-transitory computer readable medium storing a set of instructions that is executable by one or more processors of an electron beam apparatus to configure the electron beam apparatus to perform a method of observing a sample, the method comprising:
applying a first voltage to a first electrode;
applying a second voltage, different from the first voltage, to a second electrode, causing a first electric field to be created between the first and the second electrode based on a difference in the first and the second voltages, the first electric field configured to extract a plurality of primary electrons from the first electrode; and
simultaneously adjusting the first voltage to a first discrete value and the second voltage to a second discrete value different from the first discrete value, the first and the second discrete values corresponding to a range of landing energy of the plurality of primary electrons on a sample.

109. An electron beam apparatus comprising:
an electron source configured to generate a primary electron beam along a primary optical axis;
an objective lens configured to focus the primary electron beam onto a sample and comprising a cavity configured to allow the primary electron beam to pass through; and a first electron detector configured to detect a first portion of a plurality of signal electrons generated from the sample, wherein the first electron detector is located immediately upstream from a polepiece of the objective lens with respect to a path of the primary electron beam along the primary optical axis and inside the cavity of the objective lens.

110. The apparatus of clause 109, wherein the first electron detector is positioned such that a central axis of an opening of the first electron detector is aligned with the primary optical axis.

111. The apparatus of clause 110, wherein the opening of the first electron detector is smaller than the first opening of the polepiece of the objective lens.

112. The apparatus of any one of clauses 110-111, further comprising a second electron detector configured to detect a second portion of the plurality of signal electrons and disposed upstream from the first electron detector along the primary optical axis.

113. The apparatus of clause 112, wherein the opening of the first detector is configured to allow the second portion of the plurality of signal electrons to pass through.

114. The apparatus of any one of clauses 112 and 113, wherein the second electron detector comprises an opening configured to allow a portion of the primary electron beam to pass through.

115. The apparatus of clause 114, wherein the second electron detector comprises an in-lens detector positioned such that the opening of the second electron detector is aligned with the primary optical axis.

116. The apparatus of clause 114, wherein the second electron detector comprises a plurality of electron detectors located off-axis with reference to the primary optical axis.

117. The apparatus of any one of clauses 112-116, further comprising a beam manipulator configured to deflect the primary electron beam onto a surface of the sample and located between the first and the second electron detector.

118. The apparatus of clause 117, wherein the beam manipulator comprises a plurality of beam deflectors aligned with the primary optical axis and located inside the cavity of the objective lens.

119. The apparatus of any one of clauses 109-118, further comprising a third electron detector configured to detect a third portion of the plurality of signal electrons and disposed downstream from the first electron detector along the primary optical axis.

120. The apparatus of clause 119, wherein the third electron detector is disposed along the primary optical axis downstream from the first electron detector and immediately upstream from the polepiece of the objective lens.

121. The apparatus of any one of clauses 119 and 120, wherein the third electron detector is disposed along the primary optical axis between the polepiece of the objective lens and the sample.

122. The apparatus of any one of clauses 119-121, wherein a size of an opening of the third electron detector is determined based on a desired field-of-view and a distribution of the plurality of signal electrons.

123. The apparatus of any one of clauses 119-122, wherein the first, the second, and the third electron detectors are configured to detect a substantial portion of the plurality of signal electrons generated from the sample.

124. The apparatus of any one of clauses 119-123, wherein the first, the second, and the third electron detectors comprise a continuous detection surface or a segmented detection surface.

125. The apparatus of clause 124, wherein the segmented detection surface comprises a plurality of segments arranged radially or azimuthally around the primary optical axis.

126. The apparatus of any one of clauses 109-125, further comprising a control electrode disposed between the sample and the first electron detector and configured to adjust a path of the plurality of signal electrons generated from the sample.

127. The apparatus of clause 126, wherein the control electrode comprises a plurality of electrodes disposed between the first electron detector and the sample.

128. The apparatus of any one of clauses 126 and 127, wherein the control electrode is configured to influence an electrostatic field near the sample based on an applied voltage signal.

129. The apparatus of clause 128, wherein the polepiece of the objective lens is configured to substantially shield the first electron detector from the electrostatic field near the sample.

130. The apparatus of any one of clauses 128 and 129, wherein a change in the electrostatic field causes a change in a trajectory of the first portion of the plurality of signal electrons.

131. The apparatus of any one of clauses 128-130, wherein the applied voltage signal is configured to be adjustable to enable influencing an angular distribution of the plurality of signal electrons across a plurality of electron detectors that includes the first electron detector.

132. The apparatus of clause 131, wherein a position of a plane of the sample is adjustable along the primary optical axis to enable influencing the angular distribution of the plurality of signal electrons across the plurality of electron detectors and the excitation of the objective magnetic lens.

133. The apparatus of any one of clauses 109-131, wherein the objective lens comprises a compound lens, the compound lens comprising a magnetic lens and an electrostatic lens formed in presence of an electric field between the polepiece and the sample.

134. The apparatus of any one of clauses 109-133, wherein the plurality of signal electrons comprises secondary electrons, backscattered electrons, or auger electrons.

135. The apparatus of any one of clauses 109-134, wherein a vertical distance between the first electron detector and the sample is in a range of 6 mm to 80 mm.

136. The apparatus of any one of clauses 109-135, wherein the cavity comprises a space defined by an element of the magnetic lens configured to allow passage of the primary electron beam, wherein the space is rotationally symmetric around the primary optical axis.

A non-transitory computer readable medium may be provided that stores instructions for a processor of a controller (e.g., controller 50 of FIG. 1) to carry out image inspection, image acquisition, activating charged-particle source, adjusting electrical excitation of stigmators, adjusting landing energy of electrons, adjusting objective lens excitation, adjusting secondary electron detector position and orientation, stage motion control, beam separator excitation, applying scan deflection voltages to beam deflectors, receiving and processing data associated with signal information from electron detectors, configuring an electrostatic element, detecting signal electrons, adjusting the control electrode potential, adjusting the voltages applied to the electron source, extractor electrode, and the sample, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. An electron beam apparatus comprising:
   an electron source configured to generate a primary electron beam along a primary optical axis;
   a compound objective lens comprising a magnetic lens and an electrostatic lens, the magnetic lens comprising a cavity configured to allow the primary electron beam to pass through; and
   a first electron detector configured to detect a first portion of a plurality of signal electrons generated from a sample,
   wherein the first electron detector is located immediately upstream from a polepiece of the magnetic lens with respect to a path of the primary electron beam along the primary optical axis and inside the cavity of the magnetic lens.

2. The apparatus of claim 1, wherein the first electron detector is positioned such that a central axis of an opening of the first electron detector is aligned with the primary optical axis.

3. The apparatus of claim 2, wherein the opening of the first electron detector is smaller than the first opening of the polepiece of the magnetic lens.

4. The apparatus of claim 1, further comprising a second electron detector configured to detect a second portion of the plurality of signal electrons, and disposed upstream from the first electron detector along the primary optical axis.

5. The apparatus of claim 4, wherein the opening of the first detector is configured to allow the second portion of the plurality of signal electrons to pass through.

6. The apparatus of claim 4, wherein the second electron detector comprises an opening configured to allow a portion of the primary electron beam to pass through.

7. The apparatus of claim 6, wherein the second electron detector comprises an in-lens detector positioned such that the opening of the second electron detector is aligned with the primary optical axis.

8. The apparatus of claim 4, further comprising a beam manipulator configured to deflect the primary electron beam onto a surface of the sample and located between the first and the second electron detector.

9. The apparatus of claim 8, wherein the beam manipulator comprises a plurality of beam deflectors aligned with the primary optical axis and located inside the cavity of the magnetic lens.

10. The apparatus of claim 4, further comprising a third electron detector configured to detect a third portion of the plurality of signal electrons, and disposed downstream from the first electron detector along the primary optical axis.

11. The apparatus of claim 10, wherein the third electron detector is disposed immediately downstream from the polepiece of the magnetic lens.

12. The apparatus of claim 10, wherein the third electron detector is disposed along the primary optical axis between the polepiece of the magnetic lens and the sample.

13. The apparatus of claim 10, wherein a size of an opening of the third electron detector is determined based on a desired field-of-view and a distribution of the plurality of signal electrons.

14. The apparatus of claim 10, wherein the first, the second, and the third electron detectors are configured to detect substantially all of the plurality of signal electrons generated from the sample.

15. A non-transitory computer readable medium storing a set of instructions that is executable by one or more processors of an electron beam apparatus to cause the electron beam apparatus to perform a method of observing a sample, the method comprising:
   focusing a primary electron beam onto the sample using a compound objective lens comprising a magnetic lens and an electrostatic lens, the magnetic lens comprising a cavity that allows the primary electron beam to pass through;
   generating a plurality of signal electrons from the sample after interaction with the primary electron beam; and
   detecting a first portion of the plurality of signal electrons using a first electron detector located immediately upstream from a polepiece of the magnetic lens with respect to a path of the primary electron beam along a primary optical axis and inside the cavity of the magnetic lens.

* * * * *